(12) United States Patent
Lee et al.

(10) Patent No.: US 12,101,878 B2
(45) Date of Patent: Sep. 24, 2024

(54) CIRCUIT BOARD

(71) Applicant: LG INNOTEK CO., LTD., Seoul (KR)

(72) Inventors: Dong Hwa Lee, Seoul (KR); Yong Suk Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 170 days.

(21) Appl. No.: 17/906,214

(22) PCT Filed: Mar. 12, 2021

(86) PCT No.: PCT/KR2021/003125
§ 371 (c)(1),
(2) Date: Sep. 13, 2022

(87) PCT Pub. No.: WO2021/182925
PCT Pub. Date: Sep. 16, 2021

(65) Prior Publication Data
US 2023/0119237 A1    Apr. 20, 2023

(30) Foreign Application Priority Data

Mar. 13, 2020  (KR) .................. 10-2020-0031344

(51) Int. Cl.
*H05K 1/03*  (2006.01)
*H05K 1/02*  (2006.01)
(Continued)

(52) U.S. Cl.
CPC ......... *H05K 1/0366* (2013.01); *H05K 1/0373* (2013.01); *H05K 1/056* (2013.01);
(Continued)

(58) Field of Classification Search
CPC .... H05K 1/0366; H05K 1/0373; H05K 1/056; H05K 2201/0275; H05K 2201/068; H05K 3/4688; H05K 1/036; H05K 1/0271
See application file for complete search history.

(56) References Cited

U.S. PATENT DOCUMENTS

| 6,180,215 B1 | 1/2001 | Sprietsma et al. |
| 11,066,548 B2 | 7/2021 | Umehara et al. |

(Continued)

FOREIGN PATENT DOCUMENTS

| JP | 2017-128718 A | 7/2017 |
| KR | 10-2005-0049043 A | 5/2005 |

(Continued)

OTHER PUBLICATIONS

International Search Report dated Jun. 29, 2021 in International Application No. PCT/KR2021/003125.

*Primary Examiner* — Sherman Ng
(74) *Attorney, Agent, or Firm* — Saliwanchik, Lloyd & Eisenschenk

(57) ABSTRACT

A circuit board according to an embodiments includes an insulating portion comprising a plurality of insulating layers, wherein the insulating portion includes: a first insulating portion; a second insulating portion disposed on the first insulating portion and having a coefficient of thermal expansion corresponding to the first insulating portion; and a third insulating portion disposed under the first insulating portion and having a coefficient of thermal expansion corresponding to the first insulating portion; wherein the first insulating portion includes a prepreg including glass fibers, and wherein the second and third insulating portions include a resin coated copper (RCC) with a coefficient of thermal expansion in the range of 10 to 65 ($10^{-6}$ m/m·k).

20 Claims, 8 Drawing Sheets

(51) Int. Cl.
   *H05K 1/05*   (2006.01)
   *H05K 1/11*   (2006.01)
   *H05K 1/18*   (2006.01)
   *H05K 3/46*   (2006.01)

(52) U.S. Cl.
   CPC ............. *H05K 1/111* (2013.01); *H05K 1/181* (2013.01); *H05K 2201/0275* (2013.01); *H05K 2201/068* (2013.01); *H05K 2201/096* (2013.01); *H05K 2201/09827* (2013.01)

(56) References Cited

U.S. PATENT DOCUMENTS

| | | |
|---|---|---|
| 2005/0108874 A1 | 5/2005 | Ee et al. |
| 2006/0154052 A1 | 7/2006 | Waffenschmidt et al. |
| 2014/0187687 A1 | 7/2014 | Il et al. |
| 2015/0060115 A1* | 3/2015 | Lee .................. B32B 15/14 |
| | | 428/221 |
| 2018/0312683 A1 | 11/2018 | Umehara et al. |
| 2019/0254169 A1* | 8/2019 | Tay .................... H05K 1/186 |
| 2020/0281071 A1* | 9/2020 | Liu ..................... H05K 1/185 |
| 2020/0283615 A1 | 9/2020 | Umehara et al. |

FOREIGN PATENT DOCUMENTS

| | | |
|---|---|---|
| KR | 10-0669826 B1 | 1/2007 |
| KR | 10-2014-0086537 A | 7/2014 |
| KR | 10-2015-0025245 A | 3/2015 |
| KR | 10-2015-0047879 A | 5/2015 |
| KR | 10-2015-0061603 A | 6/2015 |
| KR | 10-2019-0044438 A | 4/2019 |
| KR | 10-2021-0024749 A | 3/2021 |

\* cited by examiner

CIRCUIT BOARD

CROSS-REFERENCE TO RELATED APPLICATIONS

This application is the U.S. national stage application of International Patent Application No. PCT/KR2021/003125, filed Mar. 12, 2021, which claims the benefit under 35 U.S.C. § 119 of Korean Application No. 10-2020-0031344, filed Mar. 13, 2020, the disclosures of each of which are incorporated herein by reference in their entirety.

TECHNICAL FIELD

The embodiment relates to a circuit board, and more particularly, to a circuit board having a structure capable of minimizing warpage while including an insulating layer having a low dielectric constant (Low Dk) and a low coefficient of thermal expansion (Low CTE).

BACKGROUND ART

A printed circuit board (PCB) is formed by printing a circuit line pattern on an electrically insulating substrate with a conductive material such as copper, and refers to a board before mounting electronic components. That is, the circuit board may print and fix circuit patterns connecting the components on the flat plate surface after determining the mounting positions of the components in order to densely mount many types of electronic devices on a flat plate.

The components mounted on the printed circuit board may transmit a signal generated from the component by a circuit pattern connected to each component.

On the other hand, the high frequency of signals is progressing in order to perform high-speed processing of a large amount of information along with the recent high-functionality of portable electronic devices, etc., and accordingly, there is a demand for a circuit pattern of a printed circuit board suitable for high-frequency applications.

The circuit pattern of the printed circuit board should minimize signal transmission loss to enable signal transmission without degrading the quality of high-frequency signals.

The transmission loss of a circuit pattern of a printed circuit board mainly consists of a conductor loss due to a thin metal film such as copper and a dielectric loss due to an insulator such as an insulating layer.

The conductor loss due to the thin metal film is related to the surface roughness of the circuit pattern. That is, as the surface roughness of the circuit pattern increases, transmission loss may increase due to a skin effect.

Accordingly, when the surface roughness of the circuit pattern is reduced, it is possible to inhibit a reduction in transmission loss, but there is a problem in that the adhesion between the circuit pattern and the insulating layer is reduced.

In addition, a material having a small dielectric constant may be used as an insulating layer of the circuit board in order to reduce the dielectric constant.

However, the insulating layer of the circuit board for high frequency applications requires chemical and mechanical properties for use in the circuit board in addition to the low dielectric constant.

In detail, the insulating layer used in the circuit board for high-frequency applications should have isotropy of electrical properties for ease of circuit pattern design and process, low reactivity with metal wiring materials, low ionic conductivity, sufficient mechanical strength to withstand processes such as chemical mechanical polishing (CMP), low moisture absorption to inhibit delamination or increase in dielectric constant, heat resistance to withstand the processing temperature, and a low coefficient of thermal expansion to eliminate cracking due to temperature change.

In addition, the insulating layer used in the circuit board for high-frequency applications must satisfy various conditions, such as various stresses that may be generated at the interface with other materials (eg, metal thin films), adhesive strength that can minimize peeling, crack resistance, low stress and low hot gas generation.

Accordingly, the insulating layer used in the circuit board for high-frequency applications should preferentially have low dielectric constant and low coefficient of thermal expansion, so that the overall thickness of the circuit board can be slimmed down.

However, when a circuit board is manufactured using an insulating layer made of a low dielectric material that is thinner than the threshold, reliability problems such as warpage, cracks, and peeling occur, and the degree of reliability problems such as warpage, cracks and peeling increases as a number of insulating layers of the low dielectric material increases.

Accordingly, there is a need for a method capable of resolving reliability problems such as warpage, cracks and peeling while slimming the circuit board by using an insulating layer made of a low dielectric material.

DISCLOSURE

Technical Problem

The embodiment makes it possible to achieve slimming of the circuit board.

In addition, the embodiment provides a circuit board including an insulating layer having a low dielectric constant and a circuit pattern having a low signal loss.

In addition, the embodiment provides a circuit board including a resin coated copper (RCC) having a low coefficient of thermal expansion.

In addition, the embodiment provides a hybrid type circuit board having a mixed laminated structure of a RCC and a prepreg.

In addition, the embodiment provides a circuit board capable of minimizing the occurrence of warpage by controlling a coefficient of thermal expansion of the RCC to correspond to a coefficient of thermal expansion of the prepreg.

In addition, the embodiment provides a circuit board in which the coefficient of thermal expansion of the RCC is controlled according to the total number of layers of the RCC in the overall laminated structure of the circuit board.

The technical problem to be solved in the embodiment is not limited to the technical problem mentioned above, and another technical problem not mentioned will be clearly understood by those of ordinary skill in the art to which the present invention belongs from the following description.

Technical Solution

A circuit board according to an embodiments includes an insulating portion comprising a plurality of insulating layers, wherein the insulating portion includes: a first insulating portion; a second insulating portion disposed on the first insulating portion and having a coefficient of thermal expansion corresponding to the first insulating portion; and a third insulating portion disposed under the first insulating portion and having a coefficient of thermal expansion corresponding to the first insulating portion; wherein the first insulating portion includes a prepreg including glass fibers, and wherein the second and third insulating portions include a resin coated copper (RCC) with a coefficient of thermal expansion in the range of 10 to 65 (10–6 m/m·k).

In addition, the second and third insulating portions have a number of layers in the range of 10% to 30% of a total number of layers of the plurality of insulating layers or have a thickness in the range of 10% to 30% of a total thickness of the plurality of insulating layers.

In addition, each of the second and third insulating portions includes: a RCC insulating layer, and a filler contained in the RCC insulating layer and having 40 wt % to 55 wt %.

In addition, the second and third insulating portions have a number of layers in the range of 30% to 50% of a total number of layers of the plurality of insulating layers or have a thickness in the range of 30% to 50% of a total thickness of the plurality of insulating layers, and wherein the second and third insulating portions include a resin coated copper (RCC) with a coefficient of thermal expansion in the range of 10 to 50 ($10^{-6}$ m/m·k).

In addition, each of the second and third insulating portions includes: a RCC insulating layer, and a filler contained in the RCC insulating layer and having 55 wt % to 73 wt %.

In addition, the second and third insulating portions have a number of layers in the range of 50% to 80% of a total number of layers of the plurality of insulating layers or have a thickness in the range of 50% to 80% of a total thickness of the plurality of insulating layers, and wherein the second and third insulating portions include a resin coated copper (RCC) with a coefficient of thermal expansion in the range of 10 to 50 ($10^{-6}$ m/m·k).

In addition, each of the second and third insulating portions includes: a RCC insulating layer, and a filler contained in the RCC insulating layer and having 73 wt % to 90 wt %.

In addition, the RCC forming the second and third insulating portions includes a first compound including polyphenyl ether (PPE); and a second compound including tricyclodecane and a terminal group connected to the tricyclodecane, and wherein a weight ratio of the first compound to the second compound is 4:6 to 6:4.

In addition, the terminal group includes at least one of an acrylate group, an epoxide group, a carboxyl group, a hydroxyl group, and an isocyanate group, and wherein the first compound and the second compound are not chemically bound.

In addition, the RCC forming the second and third insulating portions has a dielectric constant in the range of 2.03 to 2.7.

On the other hand, the circuit board according to the embodiment includes an insulating layer having a plurality of laminated structures, wherein the insulating layer includes at least one prepreg layer comprising glass fibers; and a resin coated copper (RCC) layer disposed on the prepreg layer, wherein the RCC layer includes a filler having a content in the range of 40 wt % to 90 wt %, and wherein the content of the filler varies within the range according to a number of layers occupied by the RCC layer in a total number of layers of the insulating layers or a thickness occupied by the RCC layer in a total thickness of the insulating layer.

In addition, the RCC layer has a number of layers in the range of 10% to 30% of the total number of layers of the insulating layer or have a thickness in the range of 10% to 30% of the total thickness of the insulating layer, and wherein the content the filler of the RCC layer has a range of 40 wt % to 55 wt %.

In addition, the RCC layer has a coefficient of thermal expansion in the range of 10 to 65 ($10^{-6}$ m/m·k).

In addition, the RCC layer has a number of layers in the range of 30% to 50% of the total number of layers of the insulating layer or have a thickness in the range of 30% to 50% of the total thickness of the insulating layer, and wherein the content the filler of the RCC layer has a range of 55 wt % to 73 wt %.

In addition, the RCC layer has a coefficient of thermal expansion in the range of 10 to 55 ($10^{-6}$ m/m·k).

In addition, the RCC layer has a number of layers in the range of 50% to 80% of the total number of layers of the insulating layer or have a thickness in the range of 50% to 80% of the total thickness of the insulating layer, and wherein the content the filler of the RCC layer has a range of 73 wt % to 90 wt %.

In addition, the RCC layer has a coefficient of thermal expansion in the range of 10 to 30 ($10^{-6}$ m/m·k).

Advantageous Effects

The circuit board according to the embodiment may include a buffer layer disposed between the insulating layer and the circuit pattern. That is, in the circuit board according to the embodiment, the buffer layer may be formed on a surface of the circuit pattern or the buffer layer may be formed on the insulating layer. The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that adhesion is reduced.

Accordingly, adhesion between the insulating layer and the circuit pattern may be improved by disposing a buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, even when the circuit board according to the embodiment is used for a high frequency purpose, it is possible to reduce the transmission loss of the high frequency signal by maintaining the surface roughness of the circuit pattern low, even if the surface roughness of the circuit pattern is kept low, it is possible to secure the adhesion between the insulating layer and the circuit pattern by the buffer layer, and thereby, the overall reliability of the circuit pattern can be ensured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and as the first material is formed in the insulating layer to be disposed inside the network structure of the second material, and thereby phase separation of the first material and the second material may be inhibited. Accordingly, the insulating layer may form the first material and the second material as a single phase, thereby improving the strength of the insulating layer.

That is, the free volume of the second material having a network structure, that is, molecular motion, is increased by cross-linking, and accordingly polymer chains having a network structure can be structured so that they are not closely arranged, and the first material and the second material may be formed as a single phase inside the insulating layer by partially disposing the first material inside the network structure.

Therefore, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

In addition, since the circuit board according to the embodiment includes an insulating layer having a low dielectric constant and a low thermal window coefficient, it can replace the existing insulating layer including glass fibers. Specifically, the circuit board according to the embodiment may remove the glass fiber included in the insulating layer. Specifically, in the circuit board according to the embodiment, the dielectric constant and the coefficient of thermal expansion of the insulating layer can be easily adjusted by using the resin and the filler of the RCC (Resin coated copper), and accordingly, the overall thickness of the printed circuit board can be reduced by configuring the insulating layer with the conventional RCC that does not include glass fibers. Furthermore, since the circuit board according to the embodiment includes an insulating layer having a low coefficient of thermal expansion, it is possible not only to remove the core layer for securing strength, but also to reduce the thickness of the insulating layer, and accordingly, it is possible to provide an insulating layer having a thickness smaller than that of the circuit pattern.

In addition, the circuit board according to the embodiment adjusts the content of the filler included in the RCC by using the characteristic that the coefficient of thermal expansion varies according to the content of the filler, and through this, the coefficient of thermal expansion of the RCC is adjusted. At this time, in the embodiment, the coefficient of thermal expansion of the RCC is determined to correspond to the coefficient of thermal expansion of the prepreg including the glass fiber. That is, as the difference between the coefficient of thermal expansion of the prepreg and the coefficient of thermal expansion of the RCC increases, the degree of occurrence of warpage of the circuit board increases. Therefore, in the embodiment, the coefficient of thermal expansion of the RCC is determined using the thermal expansion coefficient of the prepreg, so that the degree of warpage of the printed circuit board can be minimized.

In addition, the embodiment allows the coefficient of thermal expansion of the RCC to be selectively controlled according to the number of layers occupied by the RCC in the entire insulating layer laminated structure of the circuit board. Specifically, when the number of layers occupied by the RCC in the entire insulating layer laminated structure of the embodiment increases, the coefficient of thermal expansion is reduced by increasing the filler content in the RCC. Accordingly, it is possible to improve the degree of warpage that changes according to the number of layers occupied by the RCC in the circuit board of the embodiment, and accordingly, the reliability of the circuit board can be improved.

BEST MODE

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Hereinafter, circuit boards according to embodiments will be described with reference to drawings.

Figure 1:
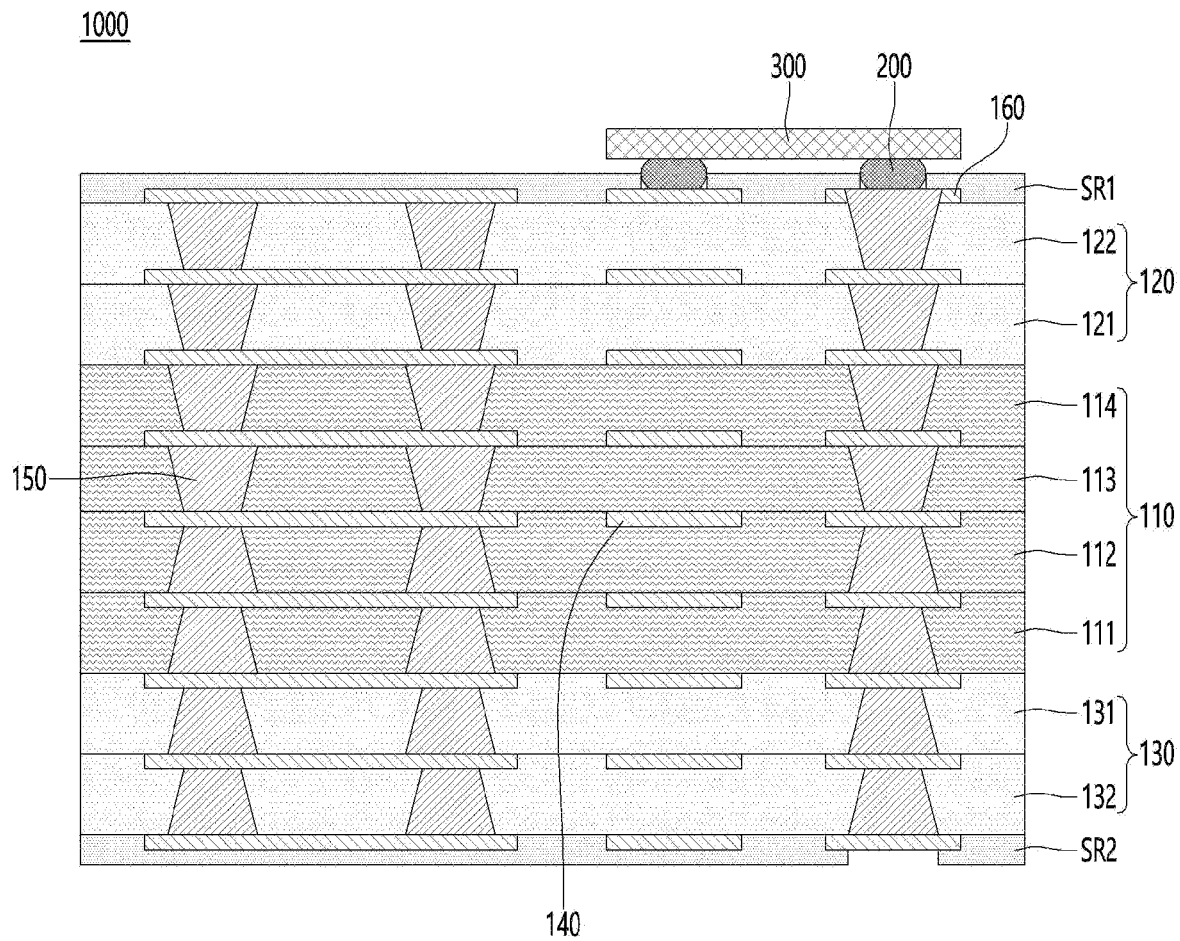
FIG. 1 is a view showing a cross-sectional view of a circuit board according to a first embodiment.

FIG. 1 is a view showing a cross-sectional view of a circuit board according to a first embodiment.

Referring to FIG. 1, a circuit board 1000 according to the first embodiment may be included an insulating substrate including first to third insulating portions 110, 120, and 130, a first pad 160, a first protective layer SR1, a second protective layer SR2, a solder paste 200, and an electronic component 300.

The insulating substrate including first to third insulating portions 110, 120, and 130 may have a flat plate structure. The insulating substrate may be a printed circuit board (PCB). Here, the insulating substrate may be implemented as a single substrate, or alternatively, may be implemented as a multilayer substrate in which a plurality of insulating layers are sequentially laminated.

Accordingly, the insulating substrate may include a plurality of insulating portions 110, 120, 130. As shown in FIG. 1, the plurality of insulating portions includes the first insulating portion 110, a second insulating portion 120 disposed on the first insulating portion 110, and a third insulating portion 130 disposed below the first insulating portion 110.

In this case, the first insulating portion 110, the second insulating portion 120, and the third insulating portion 130 may be formed of different insulating materials. Preferably, the first insulating portion 110 may include glass fiber. Also, unlike the first insulating portion 110, the second insulating portion 120 and the third insulating portion 130 may not include the glass fiber.

Accordingly, a thickness of each insulating layer forming the first insulating portion 110 may be different from a thickness of each insulating layer forming the second insulating portion 120 and the third insulating portion 130. In other words, the thickness of each insulating layer forming the first insulating portion 110 may be greater than the thickness of each insulating layer forming the second insulating portion 120 and the third insulating portion 130.

That is, the first insulating portion 110 includes glass fibers. The glass fiber generally has a thickness of about 12 μm. Accordingly, the thickness of each insulating layer forming the first insulating portion 110 may include the thickness of the glass fiber and may have a range of 19 μm to 23 μm.

Unlike this, the glass fiber is not included in the second insulating portion 120. Preferably, each insulating layer forming the second insulating portion 120 may be formed of a RCC (Resin coated Copper). Accordingly, the thickness of each insulating layer forming the second insulating portion 120 may have a range of 10 μm to 15 μm. Preferably, the thickness of each layer of the second insulating portion 120 of the RCC may be formed within a range not exceeding 15 μm.

In addition, the glass fiber is not included in the third insulating portion 130. Preferably, each insulating layer forming the third insulating portion 130 may be formed of the RCC. Accordingly, the thickness of each insulating layer forming the third insulating portion 130 may have a range of 10 μm to 15 μm That is, the insulating portion forming the circuit board in a comparative example includes a plurality of insulating layers, and all of the plurality of insulating layers were formed of the prepreg (PPG) including glass fibers. In this case, it is difficult to reduce the thickness of the glass fiber based on the PPG of the circuit board in the comparative example. This is because, when the thickness of the PPG is reduced, the glass fibers included in the PPG may be electrically connected to a circuit pattern disposed on the surface of the PPG, and thus a crack list is induced. Accordingly, in the case of reducing the thickness of the PPG of the circuit board in the comparative example, dielectric breakdown and damage to the circuit pattern may occur. Accordingly, the circuit board in the comparative example had a limit in reducing the overall thickness due to the thickness of the glass fibers of the PPG.

Moreover, since the circuit board in the comparative example is comprised with the insulating layer only of the PPG containing glass fiber, it has a high dielectric constant. However, in the case of a dielectric having a high dielectric constant, there is a problem in that it is difficult to access it as a substitute for a high frequency. That is, in the circuit board of the comparative example, since the dielectric constant of the glass fiber is high, the dielectric constant is broken in the high frequency band.

Accordingly, the insulating layer of the embodiment is formed using the RCC having a low dielectric constant, thereby reducing the thickness of the circuit board and providing a highly reliable circuit board in which signal loss is minimized even in a high frequency band. This may be achieved by properties of materials in each insulating layer forming the second insulating portion 120 and the third insulating portion 130, which will be described in more detail below.

The first insulating portion 110 may include a first insulating layer 111, a second insulating layer 112, a third insulating layer 113, and a fourth insulating layer 114 from a lower portion. In addition, each of the first insulating layer 111, the second insulating layer 112, the third insulating layer 113, and the fourth insulating layer 114 may be formed of the PPG including glass fibers.

On the other hand, the insulating substrate of the embodiment may be formed of 8 layers based on the insulating layer. However, the embodiment is not limited thereto, and the total number of layers of the insulating layer may increase or decrease.

In addition, the first insulating portion 110 of the first embodiment may be formed of four layers. For example, the first insulating portion 110 of the first embodiment may be formed of four layers of the prepreg.

In addition, the second insulating portion 120 may include a fifth insulating layer 121 and a sixth insulating layer 122 from a lower portion. The fifth insulating layer 121 and the sixth insulating layer 122 forming the second insulating portion 120 may be formed of the RCC having a low dielectric constant and a low coefficient of thermal expansion. That is, the second insulating portion 120 of the first embodiment may be formed of two layers. For example, the second insulating portion 120 of the first embodiment may be formed of two layers of the RCC.

In addition, the third insulating portion 130 may include a seventh insulating layer 131 and an eighth insulating layer 132 from an upper portion. The seventh insulating layer 131 and the eighth insulating layer 132 forming the third insulating portion 130 may be formed of the RCC having a low dielectric constant and a low coefficient of thermal expansion. That is, the third insulating portion 130 of the first embodiment may be formed of three layers. For example, the third insulating portion 130 of the first embodiment may be formed of three layers of the RCC.

Meanwhile, it is shown that the total number of layers of the insulating layer of the first embodiment is 8, the first insulating portion 110 formed of the prepreg is formed in 4 layers, and the second insulating portion 120 and the third insulating portion 130 formed of the RCC are each formed in 2 layers, but the embodiment is not limited thereto, and the number of layers of the insulating layer forming the first insulating portion 110 may increase or decrease.

However, the coefficient of thermal expansion (CTE) of each insulating layer forming the second insulating portion 120 and the third insulating portion 130 of the embodiment may be determined according to the total number of layers of the second insulating portion 120 and the third insulating portion 130.

Preferably, the coefficient of thermal expansion (CTE) of each insulating layer forming the second insulating portion 120 and the third insulating portion 130 may be determined by the coefficient of thermal expansion (CTE) of the prepreg forming the first insulating portion 110. Specifically, the RCC forming the second insulating portion 120 and the third insulating portion 130 may basically have a coefficient of thermal expansion (CTE) in a first range corresponding to a coefficient of thermal expansion (CTE) of the prepreg forming the first insulating portion 110. Furthermore, the RCC forming the second insulating portion 120 and the third insulating portion 130 may have a coefficient of thermal expansion (CTE) in a second range smaller than the first range according to the total number of layers of the insulating layer formed of the RCC. In this case, the coefficient of thermal expansion (CTE) in the second range may be included in the first range. On the other hand, the coefficient of thermal expansion (CTE) of the RCC forming the second insulating portion 120 and the third insulating portion 130 can be easily adjusted by adjusting the content of the filler included in the RCC.

The coefficient of thermal expansion (CTE) of the RCC forming the second insulating portion 120 and the third insulating portion 130 will be described in more detail below.

As described above, the circuit board according to the first embodiment includes the first insulating portion 110, the second insulating portion 120, and the third insulating portion 130, and the first insulating portion 110 may be formed of the prepreg including glass fiber, and the second insulating portion 120 and the third insulating portion 130 may be formed of the RCC having a low dielectric constant for use in a circuit board applied to a high frequency application. In addition, the second insulating portion 120 and the third insulating portion 130 may have a low dielectric constant and secure mechanical/chemical safety, thereby improving the reliability of the circuit board.

Specific characteristics of the RCC, which is an insulating layer forming the second insulating portion 120 and the third insulating portion 130, to have these characteristics will be described in detail below.

Meanwhile, a circuit pattern 140 may be disposed on a surface of the insulating layer forming each of the first insulating portion 110, the second insulating portion 120, and the third insulating portion 130.

Preferably, a circuit pattern 140 may be disposed on at least one surface of each of the first insulating layer 111, the second insulating layer 112, the third insulating layer 113, the fourth insulating layer 114, the fifth insulating layer 121, the sixth insulating layer 122, the seventh insulating layer 131 and the eighth insulating layer 132.

The circuit pattern 140 is a wire that transmits an electrical signal, and may be formed of a metal material having high electrical conductivity. To this end, the circuit pattern 140 may be formed of at least one metal material selected from gold (Au), silver (Ag), platinum (Pt), titanium (Ti), tin (Sn), copper (Cu), and zinc (Zn).

In addition, the circuit pattern 140 may be formed of a paste or solder paste including at least one metal material selected from among gold (Au), silver (Ag), platinum (Pt), titanium (Ti), tin (Sn), copper (Cu), and zinc (Zn) having excellent bonding strength. Preferably, the circuit pattern 140 may be formed of copper (Cu), which has high electrical conductivity and is relatively inexpensive.

In addition, the circuit pattern 140 may have a thickness of 12 μm±2 μm. That is, the thickness of the circuit pattern 140 may be in a range of 10 μm to 14 μm.

The circuit pattern 140 may be formed using additive process, subtractive process, MSAP (Modified Semi Additive Process), and SAP (Semi Additive Process) method, which is a typical printed circuit board manufacturing process, and a detailed description thereof will be omitted herein.

Meanwhile, a buffer layer 400 may be disposed on each of the insulating layers of the first insulating portion 110, the second insulating portion 120, and the third insulating portion 130 and/or on the surface of the circuit pattern 140. In detail, the buffer layer 400 may be disposed on the surface of at least one of top, bottom, and side surfaces of the circuit pattern 140 or on the surface of the insulating layer on which the circuit pattern is disposed.

The buffer layer formed on the insulating layer or the circuit pattern will be described in detail below.

At least one via 150 is formed in at least one of the plurality of insulating layers forming the first insulating portion 110, the second insulating portion 120, and the third insulating portion 130. The via 150 is disposed to pass through at least one insulating layer among the plurality of insulating layers. The via 150 may pass through only one insulating layer among the plurality of insulating layers. Alternatively, the via 150 may be formed while passing through at least two insulating layers among the plurality of insulating layers in common. Accordingly, the via 150 electrically connects the circuit patterns disposed on the surfaces of different insulating layers to each other.

The via 150 may be formed by filling an inside of a through hole (not shown) passing through at least one insulating layer among the plurality of insulating layers with a conductive material.

When the through hole is formed by mechanical processing, methods such as milling, drilling, and routing may be used, and when the through hole is formed by laser processing, a UV or $CO_2$ laser method may be used, and when the through hole is formed by chemical processing, drugs containing aminosilane, ketones, etc. may be used, and the like, thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the via 150 is formed by filling the inside of the through hole with a conductive material. The metal material forming the via 150 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

A first pad 160 is disposed on an uppermost insulating layer among the plurality of insulating layers (specifically, the sixth insulating layer 122 forming the second insulating portion 120), and the second pad (not shown) is disposed under a lowermost insulating layer among the plurality of insulating layers (specifically, the eighth insulating layer 132 forming the third insulating portion 130).

In other words, the first pad 160 is disposed on the uppermost insulating layer on which the electronic component 300 is to be disposed among the plurality of insulating layers. A plurality of first pads 160 may be formed on the uppermost insulating layer. In addition, a part of the first pad 160 may serve as a pattern for signal transmission, and another part may serve as an inner lead electrically connected to the electronic component 300 through a wire or the like. In other words, the first pad 160 may include a wire bonding pad for wire bonding.

In addition, the second pad (not shown) is disposed under the lowermost insulating layer to which an external substrate (not shown) is to be attached among the plurality of insulating layers. Like the first pad 160, a part of the second pad also may serve as a pattern for signal transmission, and another part of the second pad 180 may serve an an outer lead on which an adhesive member (not shown) is disposed for attachment of the external substrate. In other words, the second pad may include a soldering pad used for a soldering purpose.

In addition, a surface treatment layer (not shown) may be disposed on the first pad 160, and a surface treatment layer (not shown) may be disposed under the second pad. The surface treatment layer protects the first pad 160 and the second pad while increasing the wire bonding or soldering characteristics.

To this end, the surface treatment layer may be formed of a metal including gold (Au). Preferably, the surface treatment layer may include only pure gold (purity of 99% or more), and alternatively, may be formed of an alloy containing gold (Au). When the surface treatment layer are formed of an alloy containing gold, the alloy may be formed of a gold alloy containing cobalt.

A solder paste 200 is disposed on the uppermost insulating layer among the plurality of insulating layers. The solder paste is an adhesive for fixing the electronic component 300 attached to the insulating substrate. Accordingly, the solder paste 200 may also be referred to as an adhesive. The adhesive may be a conductive adhesive, alternatively may be a non-conductive adhesive. That is, the circuit board may be a board to which the electronic component 300 is attached by a wire bonding method, and accordingly, a terminal (not shown) of the electronic component 300 may not be disposed on the adhesive. Also, the adhesive may not be electrically connected to the electronic component 300. Accordingly, the adhesive may use a non-conductive adhesive, or alternatively, a conductive adhesive may be used.

The conductive adhesive is broadly divided into an anisotropic conductive adhesive and an isotropic conductive adhesive, and basically included conductive particles such as Ni, Au/polymer, or Ag, and thermosetting, thermoplastic, or a blend type insulating resin that mixes the characteristics of both.

In addition, the non-conductive adhesive may be a polymer adhesive, preferably a non-conductive polymer adhesive including a thermosetting resin, a thermoplastic resin, a filler, a curing agent, and a curing accelerator.

In addition, a first protective layer SR1 exposing at least a part of the surface of the first pad 160 is disposed on the uppermost insulating layer. The first protective layer SR1 is disposed to protect the surface of the uppermost insulating layer, and for example, it may be a solder resist.

Here, the electronic component 300 may include both devices and chips. The device may be divided into an active device and a passive device, and the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Consequently, the electronic component 300 may include all of a semiconductor chip, a light emitting diode chip, and other driving chips.

A resin molding portion may be formed on the uppermost insulating layer, and accordingly, the electronic component 300 and the first pad 160 may be protected by the resin molding portion.

Meanwhile, a second protective layer SR2 is disposed under the lowermost insulating layer among the plurality of insulating layers. The second protective layer SR2 has an opening exposing the surface of the second pad. The second protective layer SR2 may be formed of a solder resist.

As described above, a buffer layer may be disposed on at least one surface of the insulating layer or the circuit pattern 140.

In detail, the buffer layer 400 may be disposed between the insulating layer and the circuit pattern 140 in a region where the insulating layer and the circuit pattern 140 overlap.

The buffer layer 400 may be a surface treatment layer treated on the surface of the insulating layer. The buffer layer 400 may be a surface treatment layer treated on the surface of the circuit pattern 140.

The buffer layer 400 may be an intermediate layer disposed between the insulating layer and the circuit pattern. The buffer layer 400 may be a coating layer disposed between the insulating layer and the circuit pattern. The buffer layer 400 may be a functional layer that improves adhesion between the insulating layer and the circuit pattern, that is, an adhesion strengthening layer.

FIGS. 2 to 5 are views for explaining the position and arrangement relationship of the buffer layer 400. Hereinafter, a position and arrangement relationship of the buffer layer 400 disposed on the insulating layer forming the second insulating portion 120 among the plurality of insulating portions will be described. However, the buffer layer 400 may also be disposed on the insulating layer forming the first insulating portion 110 and the third insulating portion 130 to correspond to the position and arrangement relationship described below.

Figure 2:
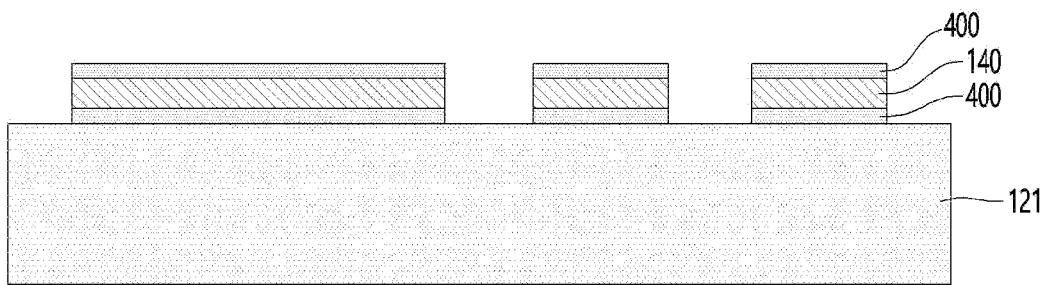
FIGS. 2 to 5 are views for explaining the arrangement relationship of a buffer layer of a circuit board according to an embodiment.

Referring to FIG. 2, the buffer layer 400 may be disposed on the surface of the circuit pattern. For example, the buffer layer 400 may be disposed on an upper surface and a lower surface of the circuit pattern. That is, the buffer layer 400 may be disposed on a surface that contacts or faces the insulating layer among the surfaces of the circuit pattern.

Figure 3:
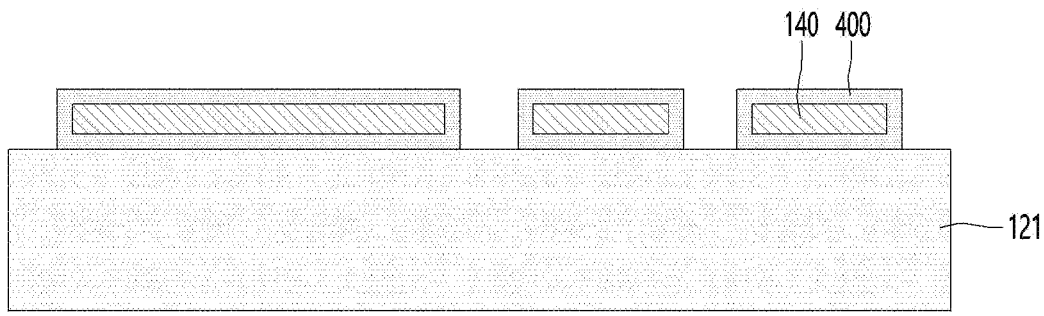

Alternatively, referring to FIG. 3, the buffer layer 400 may be disposed on the surface of the circuit pattern. For example, the buffer layer 400 may be disposed on an upper surface, a lower surface, and both sides of the circuit pattern. That is, the buffer layer 400 may be disposed to surround the entire surface of the circuit pattern.

Figure 4:
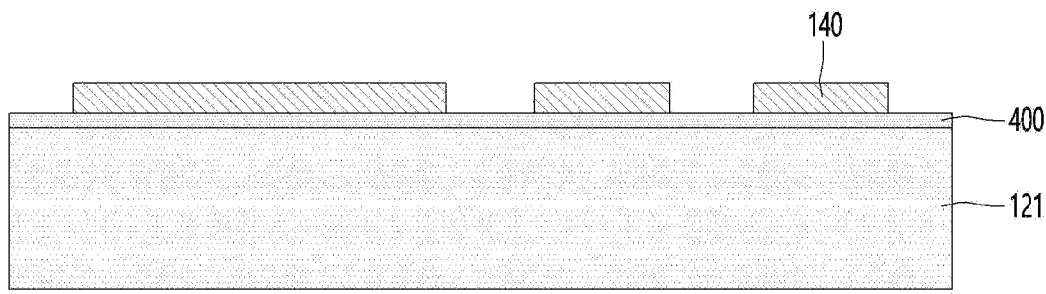

Alternatively, referring to FIG. 4, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed on the entire surface of the insulating layer on which the circuit pattern 140 is disposed.

Figure 5:
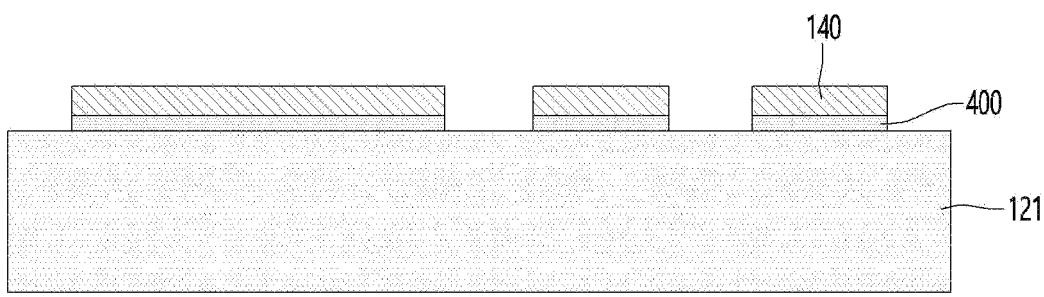

Alternatively, referring to FIG. 5, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed only in a region where the circuit pattern 140 is disposed on the surface of the insulating layer on which the circuit pattern 140 is disposed.

That is, the buffer layer 400 may be disposed between the insulating layer and the circuit pattern 140. In detail, the buffer layer 400 may be disposed between the insulating layer and the circuit pattern 140, and the buffer layer 400 may be coupled to one surface of the insulating layer and one surface of the circuit pattern 140. That is, a terminal group of the buffer layer and the terminal group of the insulating layer, and the terminal group of the buffer layer and the terminal group of the circuit pattern may be chemically bonded.

The buffer layer 400 may be formed to have a constant thickness. In detail, the buffer layer 400 may be formed as a thin film. In detail, the buffer layer 400 may be formed to a thickness of 500 nm or less. In more detail, the buffer layer 400 may be formed to a thickness of 5 nm to 500 nm.

When the thickness of the buffer layer 400 is formed to be 5 nm or less, the thickness of the buffer layer is too thin to sufficiently secure adhesion between the insulating layer and the circuit pattern, and when the thickness of the buffer layer is formed to exceed 500 nm, the effect of improving adhesion according to the thickness is insignificant, the overall thickness of the circuit board may be increased, and the dielectric constant of the insulating layer may increase, so that the transmission loss of the circuit board may increase in high frequency applications.

The buffer layer 400 may include a plurality of elements. A plurality of elements included in the buffer layer 400 are combined with each other in the buffer layer and included in molecular or ionic form, and the molecules, the molecules, and the ions may be chemically bonded to each other to form a buffer layer.

The buffer layer 400 may include at least one of a carbon element, a nitrogen element, an oxygen element, a silicon element, a sulfur element, and a metal element. In detail, the buffer layer 400 may include all of a carbon element, a nitrogen element, an oxygen element, a silicon element, a sulfur element, and a metal element.

The carbon element, nitrogen element, oxygen element, silicon element, sulfur element, and metal element may be present in a molecular form by bonding to each other in the buffer layer, or may exist in an ionic form alone.

Among the plurality of elements, the oxygen element, the carbon element, and the nitrogen element may be related to a functional group of the buffer layer coupled to the insulating layer. That is, a functional group formed by molecules including the oxygen element, the carbon element, the nitrogen atom, and the like may be chemically bonded to the insulating layer.

In addition, the carbon element, the nitrogen element, the silicon element, and the sulfur element among the plurality of elements may be related to a functional group of the buffer layer coupled to the circuit pattern. That is, a functional group formed by molecules including the carbon element, the nitrogen element, the silicon element, the sulfur element, etc. may be chemically bonded to the circuit pattern.

In addition, the metal element may combine molecules formed by the carbon element, nitrogen element, oxygen element, silicon element, and sulfur element to each other. That is, molecules formed by the carbon element, nitrogen element, oxygen element, silicon element, and sulfur element may be chemically combined through the metal element to form a buffer layer. That is, the metal element may be disposed between the molecules to serve as a medium for chemically bonding the molecules.

To this end, the carbon element, nitrogen element, oxygen element, silicon element, sulfur element, and metal element may be included in a constant mass ratio. In detail, the metal element among the plurality of elements may be included the most than other elements, and the carbon element, nitrogen element, oxygen element, silicon element, and sulfur element may each be included in a constant mass ratio based on the metal element.

Specifically, the ratio of the carbon element to the metal element ((carbon element/copper element)*100) may be 5 to 7, In addition, the ratio of the nitrogen element to the metal element ((nitrogen element/copper element)*100) may be 1.5 to 7.

In addition, the ratio of the oxygen element to the metal element ((oxygen element/copper element)*100) may be 1.1 to 1.9.

In addition, the ratio of the silicon element to the metal element ((silicon element/copper element)*100) may be 0.5 to 0.9.

In addition, the ratio of the sulfur element to the metal element ((sulfur element/copper element)*100) may be 0.5 to 1.5.

A ratio of the carbon element, nitrogen element, oxygen element, silicon element, and sulfur element to the metal element may be related to a bonding strength of the insulating layer or the circuit board.

In detail, when the ratio of the carbon element to the metal element ((carbon element/copper element)*100) is out of the range of 5 to 7, the bonding force between the buffer layer and the circuit board or the buffer layer and the insulating layer may be weakened.

In addition, when the ratio of the nitrogen element to the metal element ((nitrogen element/copper element)*100) is out of the range of 1.5 to 7, the bonding force between the buffer layer and the circuit board or the buffer layer and the insulating layer may be weakened have.

Also, when the ratio of the oxygen element to the metal element ((oxygen element/copper element)*100) is out of the range of 1.1 to 1.9, the bonding force between the buffer layer and the insulating layer may be weakened.

In addition, when the ratio of the silicon element to the metal element ((silicon element/copper element)*100) is out of the range of 0.5 to 0.9, the bonding force between the buffer layer and the circuit board may be weakened.

In addition, when the ratio of the sulfur element to the metal element ((sulfur element sulfur/copper element)*100) is out of the range of 0.5 to 1.5, the bonding force between the buffer layer and the circuit board may be weakened.

Meanwhile, the carbon element, nitrogen element, oxygen element, silicon element, sulfur element, and metal element exist in the form of molecules or ions in the buffer layer, and the molecules and the ions may be connected to each other by bonding.

In detail, the buffer layer 400 may include molecules and metal ions formed by the carbon element, nitrogen element, oxygen element, silicon element, sulfur element, and metal elements. The molecules included in the buffer layer 400 may include at least two types of molecules depending on the size of the molecule or the size of the molecular weight. In detail, the molecule may include macromolecule and unimolecule.

The macromolecule, the unimolecule, and the metal ion may be formed in a structure in which they are bonded to each other in the buffer layer.

In detail, the macromolecule, the unimolecule, and the metal ion may be chemically bonded through covalent bonds and coordination bonds in the buffer layer to form a structure in which they are connected to each other.

The metal ion may connect the macromolecules, the unimolecules, or the macromolecule and the unimolecules to each other. In detail, the macro molecules, the unimolecules, or the macromolecule and the unimolecule are coordinate bonded with the metal ion, and accordingly, the macromolecules, the unimolecule, or the macromolecule and the unimolecule can be chemically bound.

The metal ions may include the same material as the circuit pattern. Alternatively, the metal ion may include a material different from that of the circuit pattern. For example, when the circuit pattern includes copper, the metal ions may include copper or a metal other than copper.

In detail, the metal ions may be formed by the circuit pattern. In detail, metal ions may be formed by ionizing the circuit pattern including metal using a separate oxidizing agent. Accordingly, the ionized metal ions may form a buffer layer by coordinating the macro molecules and the unimolecules in the buffer layer to connect the molecules to each other.

Alternatively, a metal ion may be separately added when the buffer layer is formed, and the metal ion may form a buffer layer by coordinating the macro molecule and the single molecule in the buffer layer to connect the molecules to each other. In this case, the separately added metal ions may be the same as or different from the metal of the circuit pattern.

The macromolecule and the unimolecule may include at least one of the carbon element, nitrogen element, oxygen element, silicon element, and sulfur element.

That is, the macromolecule and the unimolecule may be molecules including at least one of the carbon element, nitrogen element, oxygen element, silicon element, and sulfur element.

In detail, the macromolecule may include a molecule including the carbon element and the nitrogen element. In detail, the macromolecule may include an azole group including the carbon element and the nitrogen element.

In addition, the macromolecule may include a molecule including the silicon element. In detail, the macro molecule may include a silane group including the silicon element.

In addition, the unimolecule may include the carbon element, the nitrogen element, and the sulfur element. That is, the unimolecule may be a molecule including the carbon element, the nitrogen element, and the sulfur element. For example, the unimolecule may include an SCN group to which a thiocyanate group (—SCN) is connected.

Figure 6:
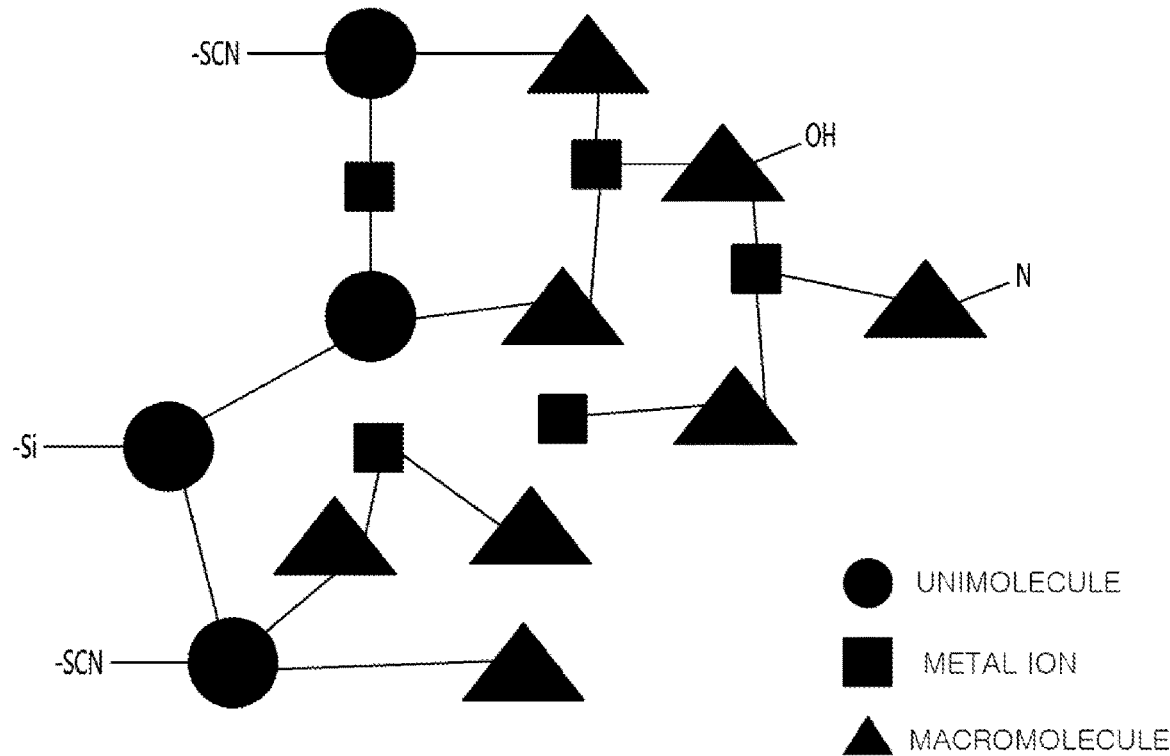
FIG. 6 is a view showing a simplified structural formula of a buffer layer of a circuit board according to an embodiment.

Referring to FIG. 6, the buffer layer 400 may include a plurality of functional groups. In detail, the buffer layer 400 may include a first functional group chemically bonded to the insulating layer and a second functional group chemically bonded to the circuit pattern 140.

That is, the macromolecule and the unimolecules may include a plurality of terminal groups, ie, functional groups, chemically bonded to the insulating layer and the circuit pattern. By these functional groups, the insulating layer and the circuit pattern are chemically tightly coupled by the buffer layer, so that adhesion between the insulating layer and the circuit pattern can be improved.

The first functional group and the second functional group may be defined as terminal groups of the buffer layer connected to one of the macromolecule, the mono atom, or the metal atom.

The first functional group may be bonded to the insulating layer by a covalent bond. The first functional group may include functional groups covalently bonded to the insulating layer. In detail, the first functional group may include a hydroxyl group (—OH) and an N group of the azole group.

In addition, the second functional group may be coupled to the circuit pattern 140 by coordination bonding. The second functional group may include functional groups coordinated with the circuit pattern 140. In detail, the second functional group may include a Si group and a thiocyanate group (—SCN) of a silane group.

The first functional group and the second functional group included in the buffer layer may be chemically bonded to the insulating layer and the circuit pattern, respectively. Accordingly, by the buffer layer disposed between the insulating layer and the circuit pattern, adhesion between the insulating layer, which is a dissimilar material, and the circuit pattern may be improved.

Meanwhile, as described above, the insulating layer forming the second insulating portion 120 and the third insulating portion 130 may include a material capable of securing mechanical/chemical reliability with a low dielectric constant.

In detail, the insulating layers 121, 122, 131, and 132 may have a dielectric constant Dk of 3.0 or less. In more detail, the insulating layers 121, 122, 131, and 132 may have a dielectric constant of 2.03 to 2.7. Accordingly, the insulating layer may have a low dielectric constant, and when the insulating layer is applied to a circuit board for high frequency use, transmission loss according to the dielectric constant of the insulating layer may be reduced.

In the laminated structure of all the insulating layer in the first embodiment, the RCC may be formed of four layers. For example, in the circuit board according to the first embodiment, an insulating layer formed of the prepreg may be formed of four layers, and an insulating layer formed of the RCC may be formed of four layers.

For example, the RCC of the circuit pattern of the first embodiment may occupy the number of layers in the range of 30% to 50% of the total number of layers of the insulating layer.

For example, the RCC of the circuit pattern of the first embodiment may occupy a thickness in the range of 30% to 50% of the total thickness of the insulating layer. Here, the total thickness of the insulating layer may mean the thickness of only the insulating layers excluding the thickness of the circuit pattern, the thickness of the buffer layer, and the thickness of the protective layer from the total thickness of the circuit board.

In this case, the insulating layers 121, 122, 131, and 132 may have a coefficient of thermal expansion of 50 ($10^{-6}$ m/m·k) or less. Here, the insulating layers 121, 122, 131 and 132 may have a coefficient of linear expansion of 50 ($10^{-6}$ m/m·k) or less, as can be seen from the unit of the coefficient of thermal expansion. In detail, the insulating layers 121, 122, 131, and 132 may have a coefficient of thermal expansion in the range of 10 to 50 ($10^{-6}$ m/m·k).

That is, the insulating layers 121, 122, 131, and 132 of the first embodiment may occupy 30% to 50% of the number of layers or thickness in the laminated structure of all of the insulating layer, and an example thereof is the insulating layers 121, 122, 131, 132 may be formed of four layers, and the RCC may each have a coefficient of thermal expansion in the range of 10 to 50 ($10^{-6}$ m/m·k).

In this case, the coefficient of thermal expansion of the insulating layers 121, 122, 131, and 132 can be easily adjusted by adjusting the content of the filler included in the insulating layers 121, 122, 131, 132.

That is, the RCC forming the insulating layers 121, 122, 131, and 132 may contain a filler of 55 wt % to 73 wt % to have a coefficient of thermal expansion in the range of 10 to 50 ($10^{-6}$ m/m·k).

At this time, when the thermal expansion coefficient of the RCC forming the insulating layers 121, 122, 131, and 132 is out of the range of 10 to 50 ($10^{-6}$ m/m·k), a problem may occur in the overall reliability of the circuit board. For example, when the coefficient of thermal expansion of the RCC forming the insulating layers 121, 122, 131, and 132 is greater than 50 ($10^{-6}$ m/m·k), warpage may occur in the lamination process of the circuit board due to mismatching with the coefficient of thermal expansion of the prepreg forming the first insulating portion 110.

That is, the circuit board is manufactured by sequentially laminating heterogeneous insulating layers including the prepreg and the RCC. In this case, continuous stress due to heat may be transferred to the circuit board in the process of sequentially laminating the prepreg and the RCC. And, the degree of warpage of the circuit board increases due to the stress as described above.

Accordingly, the stretching rate of the RCC of the embodiment corresponds to the stretching rate of the prepreg in order to minimize the stress generated during the lamination process of a hybrid type circuit board including the prepreg and the RCC, so that it is possible to minimize the degree of warpage of the circuit board.

In the above embodiment, the insulating layers 121, 122, 131, and 132 may have a low coefficient of thermal expansion, thereby minimizing cracks in the insulating layer due to temperature change.

To this end, the insulating layers 121, 122, 131, and 132 may be formed of two materials. In detail, the insulating layers 121, 122, 131, and 132 may include a material in which two compounds are mixed. In detail, the insulating layers 121, 122, 131, and 132 may include a first compound and a second compound.

The first material and the second material may be included in a certain ratio range. In detail, the first material and the second material may be included in a ratio of 4:6 to 6:4.

In addition, the insulating layers 121, 122, 131, and 132 may further include a filler. In detail, the insulating layers 121, 122, 131, and 132 may further include the filler such as silicon dioxide ($SiO_2$). The filler of the first embodiment may be included in an amount of about 55 wt % to about 73 wt % based on all of the insulating layer 121, 122, 131, 132.

When the ratio of the filler is out of the above range, the coefficient of thermal expansion or the dielectric constant may be increased by the filler, and thus properties of the insulating layer may be deteriorated and a warpage phenomenon may occur due to mismatching of the coefficient of thermal expansion with the prepreg.

Also, the first material and the second material may be chemically non-bonded with each other in the insulating layers 121, 122, 131 and 132. However, embodiments are not limited thereto, and the first material including the first compound and the second material including the second compound may be chemically bonded directly or through a separate linking group.

The first material may include a material having an insulating property. In addition, the first material may have improved mechanical properties due to high impact strength. In detail, the first material may include a resin material. For example, the first material may include a first compound including polyphenyl ether (PPE) represented by chemical formula 1 below.

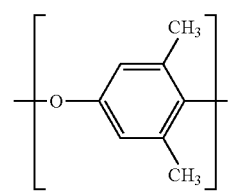

[chemical formula 1]

The first material may include a plurality of the first compounds, and the first compounds may be formed by chemically bonding with each other. In detail, the first compound may be linearly connected to each other by a covalent bond, that is, a pi-pi bond (π-π) as shown in chemical formula 2 below.

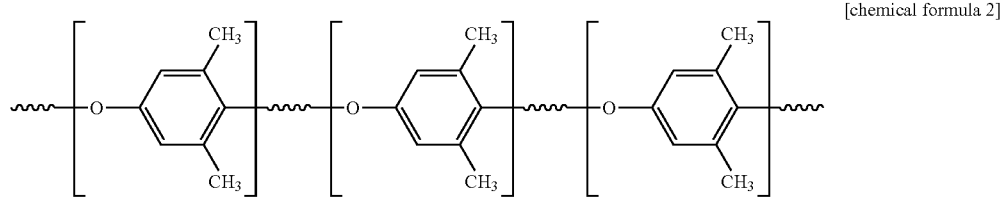

[chemical formula 2]

That is, the first compounds may be formed by chemically bonding with each other so that the first material has a molecular weight of about 300 to 500.

In addition, the second material may include a second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C=C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C=C bonding) to form a network structure.

Figure 7:
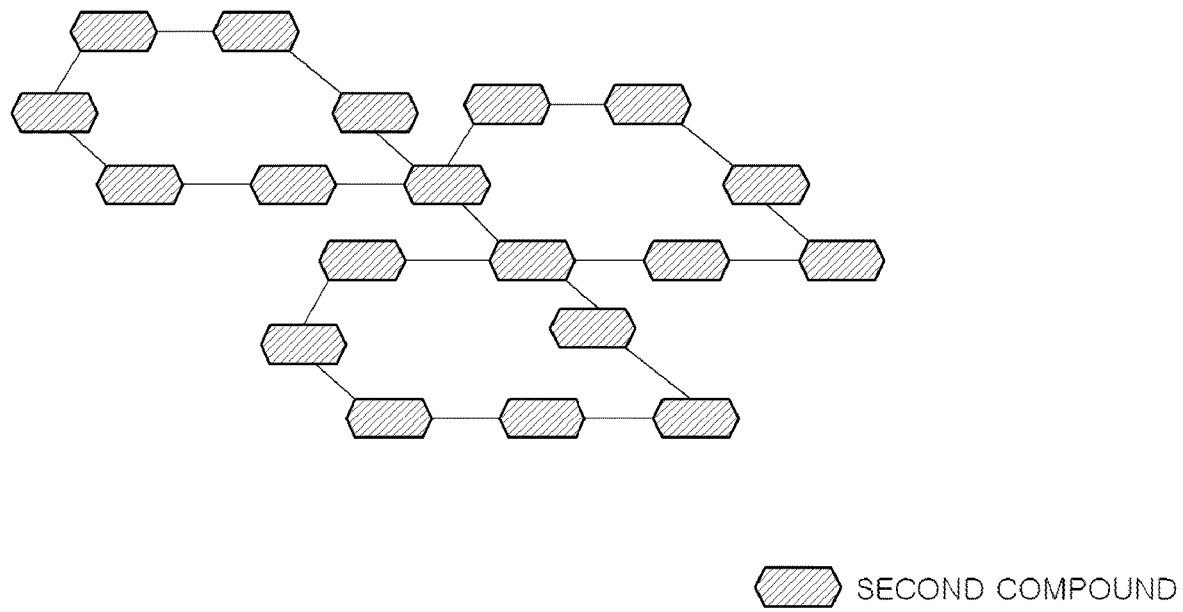
FIG. 7 is a view showing a structure of a second material included in an insulating layer of a circuit board according to an embodiment.

Specifically, referring to FIG. 7, the second compounds may be cross-linked to form a network structure. That is, the second compounds may be an aggregate of bonds having a plurality of network structures.

Accordingly, the second material formed by the second compounds may have a low dielectric constant and a low coefficient of thermal expansion according to material properties, and may have improved mechanical strength due to the network structure.

Figure 8:
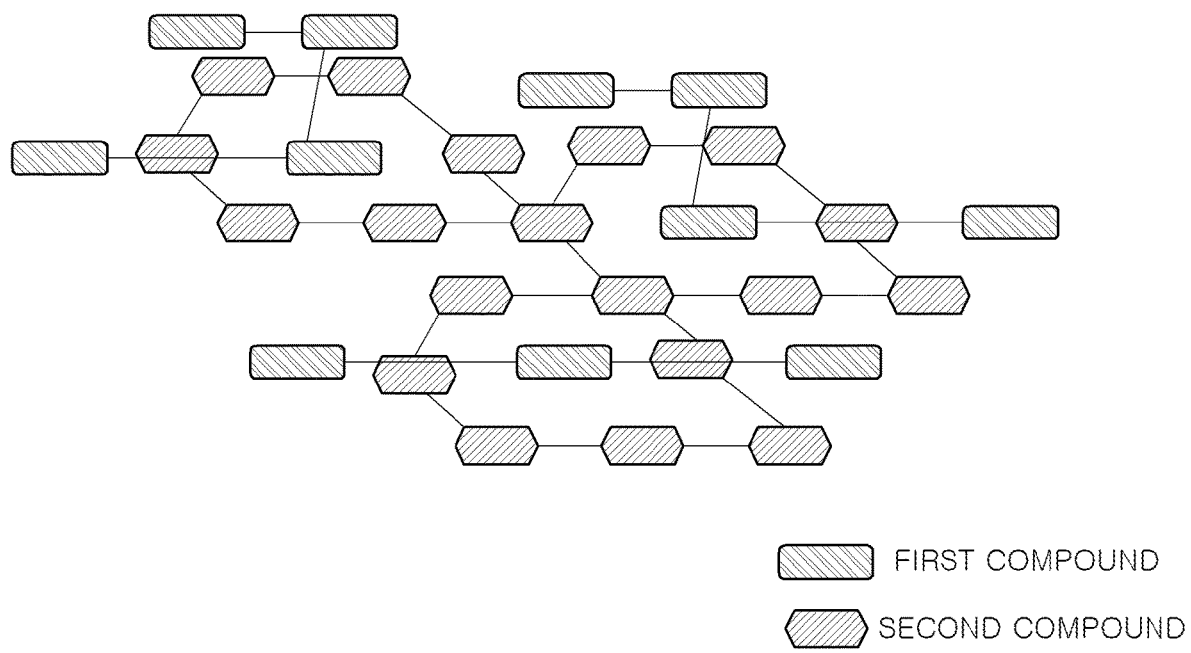
FIG. 8 is a view showing an arrangement structure of a first material and a second material included in an insulating layer of a circuit board according to an embodiment.

FIG. 8 is a view for explaining an arrangement of the first material and the second material forming the insulating layer.

The first material and the second material may be formed as one single phase in the insulating layer. Referring to FIG. 8, the first material connected by the covalent bond of the first compound may be disposed inside the second material formed by the second compound cross-linked to each other to form a network structure.

In detail, the first compound may be disposed inside the network structure of the second material formed by chemically bonding the second compound to inhibit the first material from being separated from the second material.

That is, in the insulating layer, the first material and the second material are not disposed to be phase-separated in the insulating layer, and may be formed in a one single-phase structure. Accordingly, since the first material and the second material have a low dielectric constant and a low coefficient of thermal expansion due to material properties of the first material and the second material, they may be formed as a single phase, and thus have high mechanical strength.

On the other hand, the first insulating portion 110 of the first embodiment includes an insulating layer of the PPG including glass fiber, and the second insulating portion 120 and the third insulating portion 130 include the RCC having a low dielectric constant and a low coefficient of thermal expansion as described above.

As described above, the coefficient of thermal expansion of each insulating layer forming the second insulating portion 120 and the third insulating portion 130 may range of 10 to 50 ($10^{-6}$ m/m·k). To this end, each insulating layer forming the second insulating portion 120 and the third insulating portion 130 of the first embodiment may be formed of the RCC, which contains 55 wt % to 73 wt % filler.

As described above, the coefficient of thermal expansion of the RCC of the first embodiment is included in a first range as the RCC forming the second insulating portion 120 and the third insulating portion 130 is formed of a total of four layers.

In this case, the coefficient of thermal expansion of the RCC may have a second range smaller than the first range according to the number of layers, and may have a third range larger than the first range. That is, the coefficient of thermal expansion of the RCC may have a second range smaller than the first range when the number of layers increases (five or more layers). In addition, the coefficient of thermal expansion of the RCC may have a third range greater than the first range when the number of layers is decreased (3 layers or less).

Hereinafter, the present invention will be described in more detail through the measurement of the dielectric constant of the RCC forming the second insulating portion and the third insulating portion according to the Examples and Comparative Examples of the present application. These embodiments are merely presented as examples in order to explain the present invention in more detail. Therefore, the present invention is not limited to these examples.

Embodiment 1

A copper layer was formed on the insulating layer. At this time, after coating a coating layer containing a carbon element, a nitrogen element, an oxygen element, a silicon element, a sulfur element, and a metal element on the surface of the circuit layer in contact with the insulating layer, the copper layer and the insulating layer were adhered.

Then, the copper layer was patterned to form a circuit pattern, thereby manufacturing a circuit board.

In this case, the buffer layer included a first functional group including a hydroxyl group (—OH) and an N group of the azole group, and a second functional group including a Si group and a thiocyanate group (—SCN) of a silane group.

Next, adhesion and reliability were evaluated according to the roughness size of the circuit pattern.

Comparative Example 1

A circuit pattern was formed in the same manner as in the embodiment, except that a copper layer was formed by directly bonding a copper layer on the insulating layer without forming a coating layer on the copper layer, and a circuit pattern was formed by patterning the copper layer. And, after the forming of the circuit pattern, evaluation of adhesion and reliability according to the roughness size of the circuit pattern was performed.

Adhesion/Reliability Measurement Method

For evaluation of the adhesion of the circuit patterns according to embodiments and Comparative Examples, the UTM 90° Peel value was measured using UTM equipment.

In addition, reliability evaluation was evaluated by MG when the peel strength (kgf/cm) of the circuit pattern was less than 0.6.

TABLE 1

| roughness of circuit pattern(Ra, mm) | Embodiment 1 (peel strength, kgf/cm) | Comparative Example 1 (peel strength, kgf/cm) |
| --- | --- | --- |
| 0.1 | 0.65 | 0.37 |
| 0.2 | 0.72 | 0.41 |
| 0.3 | 0.73 | 0.45 |
| 0.4 | 0.74 | 0.52 |
| 0.5 | 0.78 | 0.60 |
| 0.6 | 0.81 | 0.67 |

TABLE 2

| roughness of circuit pattern(Ra, mm) | Embodiment 1 (reliability, peeling or not) | Comparative Example 1 (reliability, peeling or not) |
| --- | --- | --- |
| 0.1 | OK | NG |
| 0.2 | OK | NG |
| 0.3 | OK | NG |
| 0.4 | OK | NG |
| 0.5 | OK | NG |
| 0.6 | OK | OK |

Referring to Tables 1 and 2, it can be seen that the circuit board according to embodiment 1 has improved reliability compared to the circuit board according to Comparative Example 1. In detail, the circuit board according to embodiment 1 forms a circuit pattern in which a coating layer is coated on an insulating layer. Accordingly, as the coating layer is chemically tightly bonded to the insulating layer and the circuit pattern, the peel strength of the circuit pattern can be increased, and accordingly, it can be seen that the adhesion of the circuit pattern and the reliability of the circuit board can be improved. That is, it can be seen that the circuit board according to the embodiment 1 can have an adhesive force that can secure the reliability of the circuit board even when the roughness of the circuit pattern is reduced. In detail, it can be seen that the circuit board according to the embodiment 1 may have an adhesive force capable of securing the reliability of the circuit board even when the surface roughness of the circuit pattern is 0.5 or less or in the range of 0.1 to 0.5. That is, the circuit board according to the first embodiment can reduce the illuminance of the circuit pattern when applied to high-frequency applications, and accordingly, it is possible to reduce the transmission loss due to the skin effect, and even with a low surface roughness, the reliability of the circuit pattern can be secured by improving the adhesion of the circuit pattern by the coating layer.

On the other hand, in the case of the circuit board according to Comparative Example 1, a circuit pattern is formed directly on the insulating layer. Accordingly, as the insulating layer and the circuit pattern are formed of different materials, it can be seen that the adhesive force of the circuit pattern, that is, the peel strength, is very low.

That is, it can be seen that, in the circuit board according to Comparative Example 1, reliability can be secured only when the surface roughness of the circuit pattern is increased, and when the circuit pattern has a low surface roughness, the reliability of the circuit board is reduced.

Therefore, when the circuit board according to Comparative Example 1 is applied to a high frequency application, it can be seen that the transmission loss due to the skin effect is increased due to the surface roughness of the circuit pattern.

Embodiment 2

A copper layer was formed on the insulating layer.

Then, the copper layer was patterned to form a circuit pattern, thereby manufacturing a circuit board.

At this time, the insulating was formed by putting Tricyclodecane-based di-acrylate in which an acrylate is linked to polyphenyl ether (PPE) and tricyclodecane in a toluene solvent, mixing at a temperature of about 100° C., and adding an Azo compound initiator and a peroxide initiator.

Then, by varying the frequency size, the dielectric constant, reliability, and coefficient of thermal expansion of the insulating layer according to the weight ratio of the polyphenylether (A) and tricyclodecane based di-acrylate (B) were measured.

TABLE 3

| weight ratio of A and B | Dk | | | Df | | |
| --- | --- | --- | --- | --- | --- | --- |
| | 1 GHz | 500 MHz | 100 MHz | 1 GHz | 500 MHz | 100 MHz |
| 8:2 | 2.53 | 2.54 | 2.52 | 0.018 | 0.016 | 0.016 |
| 6:4 | 2.13 | 2.15 | 2.20 | 0.012 | 0.011 | 0.011 |
| 4:6 | 2.03 | 2.04 | 2.08 | 0.008 | 0.007 | 0.007 |
| 2:8 | 3.06 | 3.15 | 3.4 | 0.043 | 0.049 | 0.046 |

TABLE 4

| weight ratio of A and B | coefficient of thermal expansion (ppm/° C.) |
| --- | --- |
| 6:4 | 35 |
| 4:6 | 39 |

TABLE 5

| weight ratio of A and B | Reliability evaluation |
| --- | --- |
| 8:2 | NG (cracking) |
| 6:4 | OK |
| 4:6 | OK |
| 2:8 | NG (cracking) |

Referring to Tables 3 to 5, the insulating layer according to the embodiment has a low dielectric constant and a coefficient of thermal expansion when polyphenyl ether (A) and tricyclodecane based di-acrylate (B) satisfy a ratio of 4:6 to 6:4, and it can be seen that the reliability is improved by the improved mechanical strength. On the other hand, when the insulating layer does not satisfy the ratio of polyphenyl ether (A) and tricyclodecane based di-acrylate (B), mechanical strength may decrease and cracks may occur in the insulating layer, it can be seen that the dielectric constant is increased, making it unsuitable for use as an insulating layer of a high frequency circuit board.

Meanwhile, the thickness of each insulating layer forming the second insulating portion 120 and the third insulating portion 130 of the embodiment may be reduced by forming the second insulating portion 120 and the third insulating portion 130 as the RCC.

Figure 9:
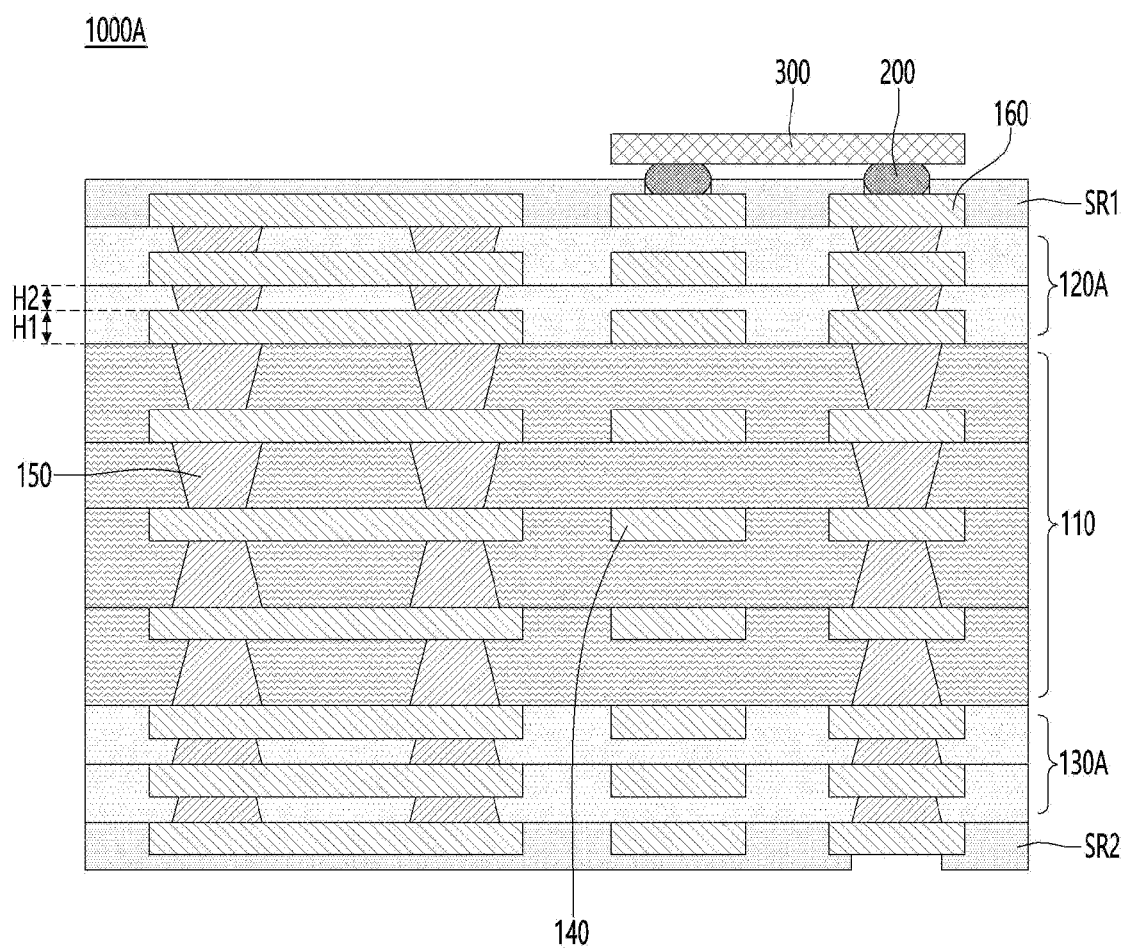
FIG. 9 is a view showing a cross-sectional view of a circuit board according to a second embodiment.

FIG. 9 is a view showing a cross-sectional view of a circuit board according to a second embodiment.

Referring to FIG. 9, the circuit board 1000A may include an insulating substrate including first to third insulating portions, a first pad 160, a first protective layer SR1 a second protective layer SR2, and a solder paste 200, and an electronic component 300.

The insulating substrate may be formed an insulating portion including a plurality of insulating layers.

As described in FIG. 1, the insulating portions may include a first insulating portion 110 formed of the prepreg, a second insulating portion 120A disposed on the first insulating portion 110 and formed of the RCC, and a third insulating portion 130A disposed under the first insulating portion 110 and formed of the RCC.

In this case, a thickness of the insulating layer forming the second insulating portion 120A and the third insulating portion 130A of the second embodiment may be reduced as the second insulating portion 120A and the third insulating portion 130A are formed of the RCC.

Accordingly, the thickness H2 of each insulating layer forming the second insulating portion 120A and the third insulating portion 130A of the second embodiment may be smaller than the thickness H1 of the circuit pattern 140.

For example, the thickness H1 of the circuit pattern 140 may have a thickness of 12 μm±2 μm. That is, the thickness H1 of the circuit pattern 140 may have a range of 10 μm to 14 μm.

In addition, the thickness H2 of each insulating layer forming the second insulating portion 120A and the third insulating portion 130A may have a thickness of 8 μm±2 μm. That is, the thickness of each insulating layer forming the second insulating portion 120A and the third insulating portion 130A may be in a range of 6 μm to 10 μm. In this case, the thickness H2 of each insulating layer forming the second insulating portion 120A and the third insulating portion 130A may be defined as a height of a portion protruding on an upper surface of the circuit pattern 140.

Accordingly, a thickness of the via 150 disposed in each insulating layer forming the second insulating portion 120A and the third insulating portion 130A may be smaller than the thickness of the circuit pattern 140.

On the other hand, the RCC of the first embodiment was forming to occupy 30% to 50% of the thickness or the number of layers in the entire laminated structure of the insulating layer. Alternatively, the number of layers or thickness occupied by the RCC may increase or decrease.

Figure 10:
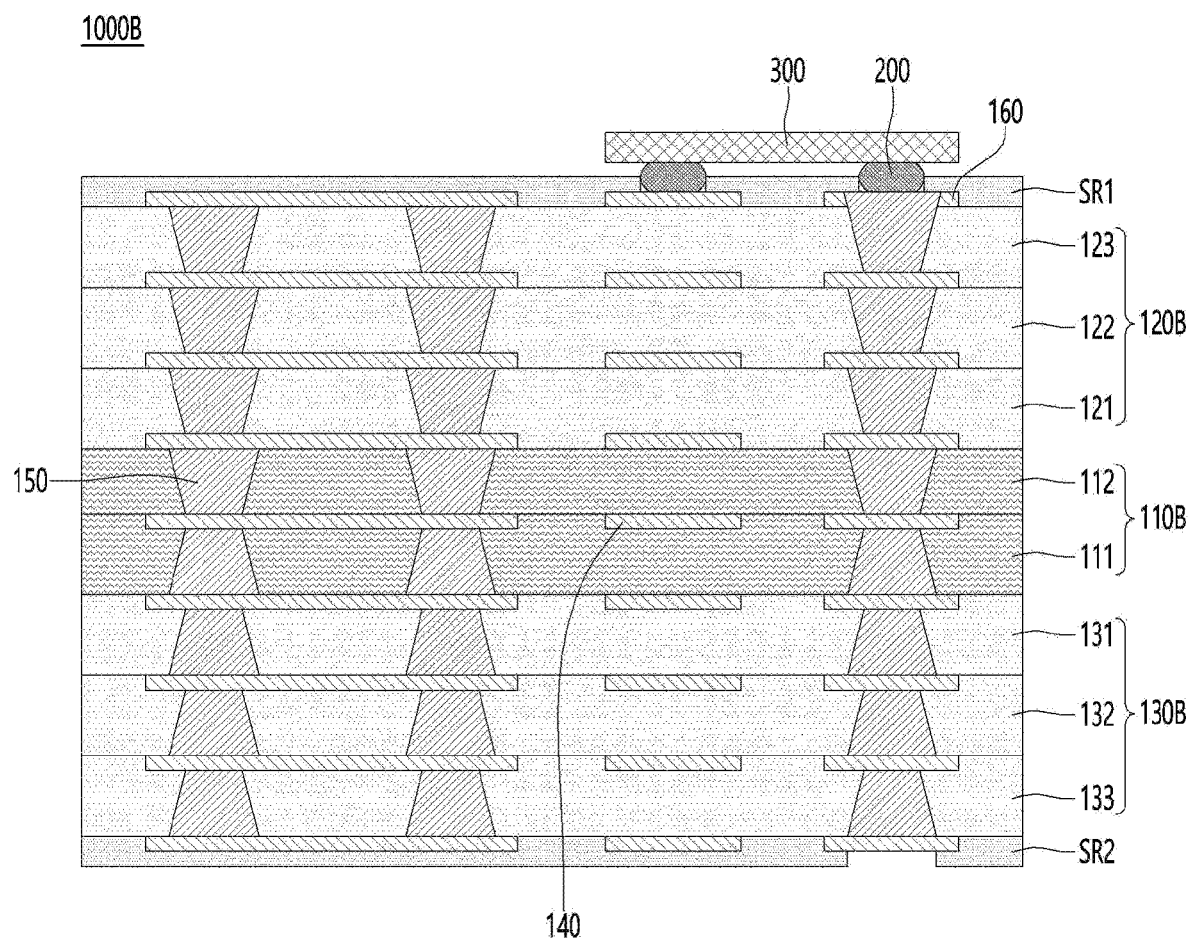
FIG. 10 is a view showing a cross-sectional view of a circuit board according to a third embodiment.

FIG. 10 is a view showing a cross-sectional view of a circuit board according to a third embodiment.

Referring to FIG. 10, the circuit board 1000B may include an insulating substrate including first to third insulating portions, a first pad 160, a first protective layer SR1, a second protective layer SR2, a solder paste 200 and an electronic component 300.

The insulating substrate may be formed of an insulating portion including a plurality of insulating layers.

The insulating portion may include a first insulating portion 110B formed of the prepreg, a second insulating portion 120B disposed on the first insulating portion 110B and formed of the RCC, and a third insulating portion 130B disposed under the first insulating portion 110B and formed of the RCC.

In this case, the number of layers of the first insulating portion, the second insulating portion, and the third insulating portion in the third embodiment may be different from that of the first embodiment.

That is, the first insulating portion of the first embodiment is formed of four layers, but the first insulating portion 110B of the third embodiment may be formed of two layers of the prepreg.

In addition, each of the second and third insulating portions of the first embodiment is formed of two layers, whereby the RCC is formed of a total of four layers. Alternatively, each of the second and third insulating portions 120B and 130B of the third embodiment may have three layers and may include a total of the six RCC layers.

That is, the RCC of the first embodiment occupies 30% to 50% of the thickness or number of layers in the entire laminated structure of the insulating layer, but the RCC of the third embodiment may occupy 50% to 80% of the thickness or the number of layers.

As such, the coefficient of thermal expansion of the RCC of the third embodiment may have a second range different from the first range of the first embodiment as the number or thickness of the RCC increases, unlike the first embodiment.

That is, the insulating layers forming the second and third insulating portions 120B and 130B may include a material capable of securing mechanical/chemical reliability with a low dielectric constant.

In detail, the insulating layers forming the second and third insulating portions 120B and 130B may have a dielectric constant Dk of 3.0 or less. In more detail, the insulating layers forming the second and third insulating portions 120B and 130B may have a dielectric constant of 2.03 to 2.7. Accordingly, the insulating layer may have a low dielectric constant, and when the insulating layer is applied to a circuit board for high frequency use, transmission loss according to the dielectric constant of the insulating layer may be reduced.

In addition, the insulating layers forming the second and third insulating portions 120B and 130B may have a coefficient of thermal expansion of 30 ($10^{-6}$ m/m·k) or less. Here, the insulating layers forming the second and third insulating portions 120B and 130B may have a coefficient of linear expansion of 30 ($10^{-6}$ m/m·k) or less, as can be seen from the unit of the coefficient of thermal expansion. In detail, the insulating layers forming the second and third insulating parts 120B and 130B may have a coefficient of thermal expansion in the range of 10 to 30 ($10^{-6}$ m/m·k).

That is, the insulating layers forming the second and third insulating portions 120B and 130B of the third embodiment occupy 50% to 80% of the thickness or the number of layers in the entire laminated structure of the insulating layer. In this case, each of the RCC of the six layers may have a coefficient of thermal expansion in the range of 10 to 30 ($10^{-6}$ m/m·k).

In this case, the coefficient of thermal expansion of the insulating layers forming the second and third insulating portions 120B and 130B can be easily adjusted by adjusting the content of fillers included in the insulating layer.

That is, the RCC forming the insulating layer of the second and third insulating portions 120B and 130B may include 73 wt % to 90 wt % of the filler to have a coefficient of thermal expansion in the range of 10 to 30 ($10^{-6}$ m/m·k).

At this time, when the RCC, which is the insulating layer forming the second and third insulating portions 120B and 130B, is formed of 6 layers and the coefficient of thermal expansion is out of the range of 10 to 30 ($10^{-6}$ m/m·k), a problem may occur in the overall reliability of the circuit board. For example, when the thermal expansion coefficient of the RCC forming the second and third insulating portions 120B and 130B is greater than 30 ($10^{-6}$ m/m·k), warpage may occur in the lamination process of the circuit board due to mismatch with the coefficient of thermal expansion of the prepreg forming the first insulating portion 110.

That is, the circuit board is manufactured by sequentially laminating heterogeneous insulating layers formed of the prepreg and the RCC. In this case, continuous stress due to heat may be transferred to the circuit board in the process of sequentially laminating the prepreg and the RCC. And, the degree of warpage of the circuit board increases due to the stress as described above.

Accordingly, the stretching rate of the RCC of the embodiment corresponds to the stretching rate of the prepreg in order to minimize the stress generated during the lamination process of a hybrid type circuit board formed of the prepreg and the RCC, so that it is possible to minimize the degree of warpage of the circuit board.

In the above embodiment, the insulating layers forming the second and third insulating portions 120B and 130B may have a low coefficient of thermal expansion, thereby minimizing cracks in the insulating layer due to temperature change. To this end, the insulating layers forming the second and third insulating portions 120B and 130B may be formed of two materials. In detail, the insulating layers forming the second and third insulating portions 120B and 130B may include a material in which two compounds are mixed. In detail, the insulating layers forming the second and third insulating portions 120B and 130B may include a first compound and a second compound.

The first material and the second material may be included in a certain ratio range. In detail, the first material and the second material may be included in a ratio of 4:6 to 6:4. In addition, the insulating layers forming the second and third insulating portions 120B and 130B may further include a filler. In detail, the insulating layers forming the second and third insulating portions 120B and 130B may further include the filler such as silicon dioxide ($SiO_2$). The filler of the third embodiment may be included in an amount of about 73 wt % to about 90 wt % based on all of the insulating layer forming the second and third insulating portions 120B and 130B.

When the ratio of the filler is out of the above range, the coefficient of thermal expansion or the dielectric constant may be increased by the filler, and thus properties of the insulating layer may be deteriorated and a warpage phenomenon may occur due to mismatching of the coefficient of thermal expansion with the prepreg.

Meanwhile, the RCC of the first embodiment was formed of 4 layers, and the RCC of the third embodiment was formed of 6 layers. On the contrary, the RCC of the fourth embodiment may be formed of only two layers.

Figure 11:
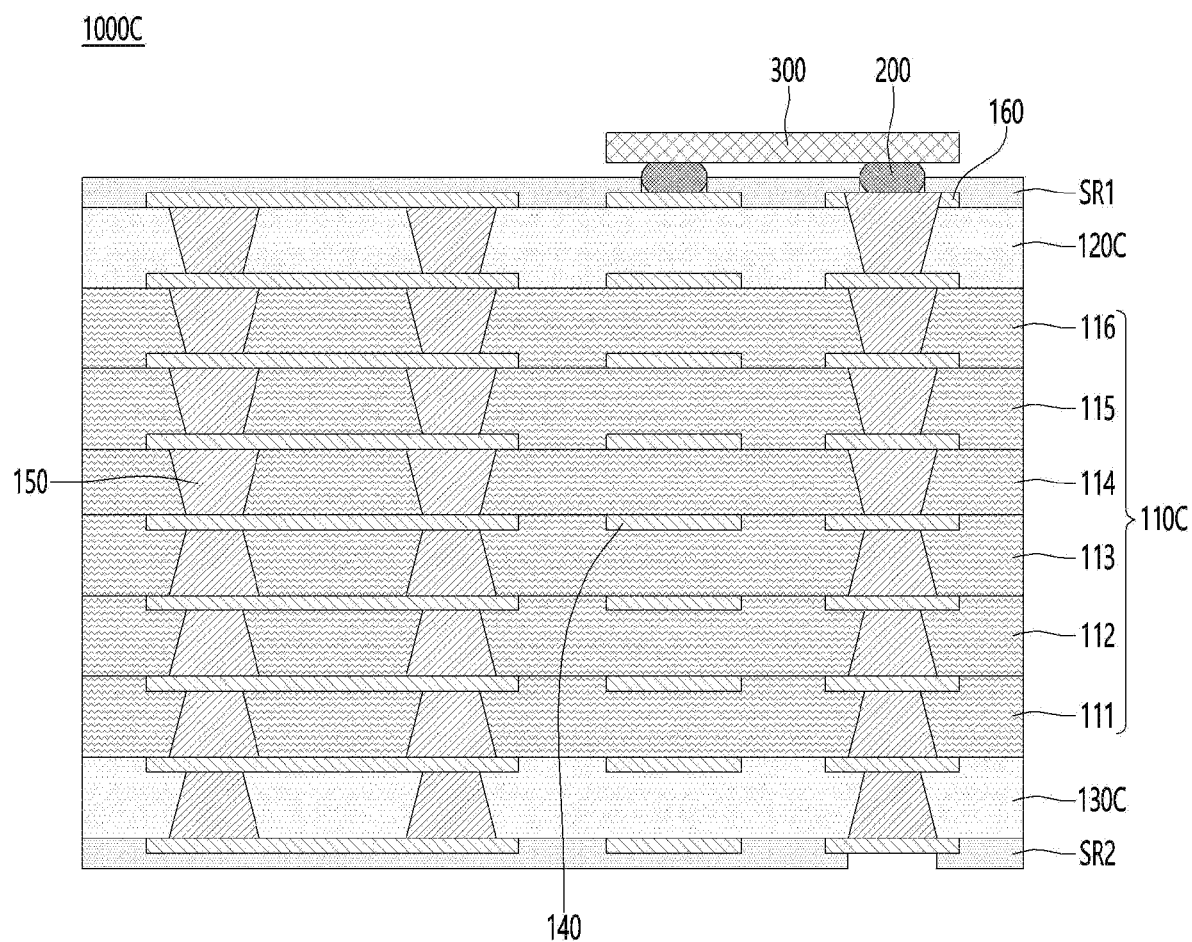
FIG. 11 is a view showing a cross-sectional view of a circuit board according to a fourth embodiment.

FIG. 11 is a view showing a cross-sectional view of a circuit board according to a fourth embodiment.

Referring to FIG. 11, the circuit board 1000C may include an insulating substrate including first to third insulating portions, a first pad 160, a first protective layer SR1, a second protective layer SR2, a solder paste 200 and an electronic component 300.

The insulating substrate may be formed of an insulating portion including a plurality of insulating layers.

The insulating portion may include a first insulating portion 110C formed of the prepreg, a second insulating portion 120C disposed on the first insulating portion 110C and formed of the RCC, and a third insulating portion 130C disposed under the first insulating portion 110C and formed of the RCC.

In this case, the number of layers of the first insulating portion, the second insulating portion, and the third insulating portion in the fourth embodiment may be different from that of the first embodiment and the third embodiment.

That is, the first insulating portion of the first embodiment is formed of four layers, and the first insulating portion of the third embodiment is formed of two layers, but the first insulating portion 110C of the third embodiment may be formed of six layers of the prepreg.

In addition, each of the second and third insulating portions of the first embodiment is formed of two layers, whereby the RCC is formed of a total of four layers. Alternatively, each of the second and third insulating portions 120C and 130C of the fourth embodiment may have one layer and may include a total of the two RCC layers.

That is, the RCC of the fourth embodiment may occupy 10% to 30% of the thickness or the number of layers.

For example, the RCC of the fourth embodiment may occupy 10% to 30% of the total number of insulating layers. For example, the RCC of the fourth embodiment may occupy 10% to 30% of the thickness of the entire insulating layer.

As such, the coefficient of thermal expansion of the RCC of the third embodiment may have a third range different from the first range of the first embodiment as the number or thickness of the RCC increases, unlike the first embodiment.

That is, the insulating layers forming the second and third insulating portions 120C and 130C may include a material capable of securing mechanical/chemical reliability with a low dielectric constant.

In detail, the insulating layers forming the second and third insulating portions 120C and 130C may have a dielectric constant Dk of 3.0 or less. In more detail, the insulating layers forming the second and third insulating portions 120B and 130B may have a dielectric constant of 2.03 to 2.7. Accordingly, the insulating layer may have a low dielectric constant, and when the insulating layer is applied to a circuit board for high frequency use, transmission loss according to the dielectric constant of the insulating layer may be reduced.

In addition, the insulating layers forming the second and third insulating portions 120B and 130B may have a coefficient of thermal expansion of 30 ($10^{-6}$ m/m·k) or less. Here, the insulating layers forming the second and third insulating portions 120B and 130B may have a coefficient of linear expansion of 30 ($10^{-6}$ m/m·k) or less, as can be seen from the unit of the coefficient of thermal expansion. In detail, the insulating layers forming the second and third insulating parts 120C and 130C may have a coefficient of thermal expansion in the range of 10 to 65 ($10^{-6}$ m/m·k).

That is, the insulating layers forming the second and third insulating portions 120C and 130C in the fourth embodiment are formed of two layers. As described above, when the RCC is formed of two layers in the entire laminated structure of the circuit board, the RCC of the two layers may each have a coefficient of thermal expansion in the range of 10 to 65 ($10^{-6}$ m/m·k).

In this case, the coefficient of thermal expansion of the insulating layers forming the second and third insulating portions 120C and 130C can be easily adjusted by adjusting the content of fillers included in the insulating layer.

That is, the RCC forming the insulating layer of the second and third insulating portions 120C and 130C may include 40 wt % to 55 wt % of the filler to have a coefficient of thermal expansion in the range of 10 to 65 ($10^{-6}$ m/m·k).

At this time, when the RCC, which is the insulating layer forming the second and third insulating portions 120C and 130C, is formed of 6 layers and the coefficient of thermal expansion is out of the range of 10 to 65 ($10^{-6}$ m/m·k), a problem may occur in the overall reliability of the circuit board. For example, when the thermal expansion coefficient of the RCC forming the second and third insulating portions 120C and 130C is greater than 65 ($10^{-6}$ m/m·k), warpage may occur in the lamination process of the circuit board due to mismatch with the coefficient of thermal expansion of the prepreg forming the first insulating portion 110.

Figure 12:
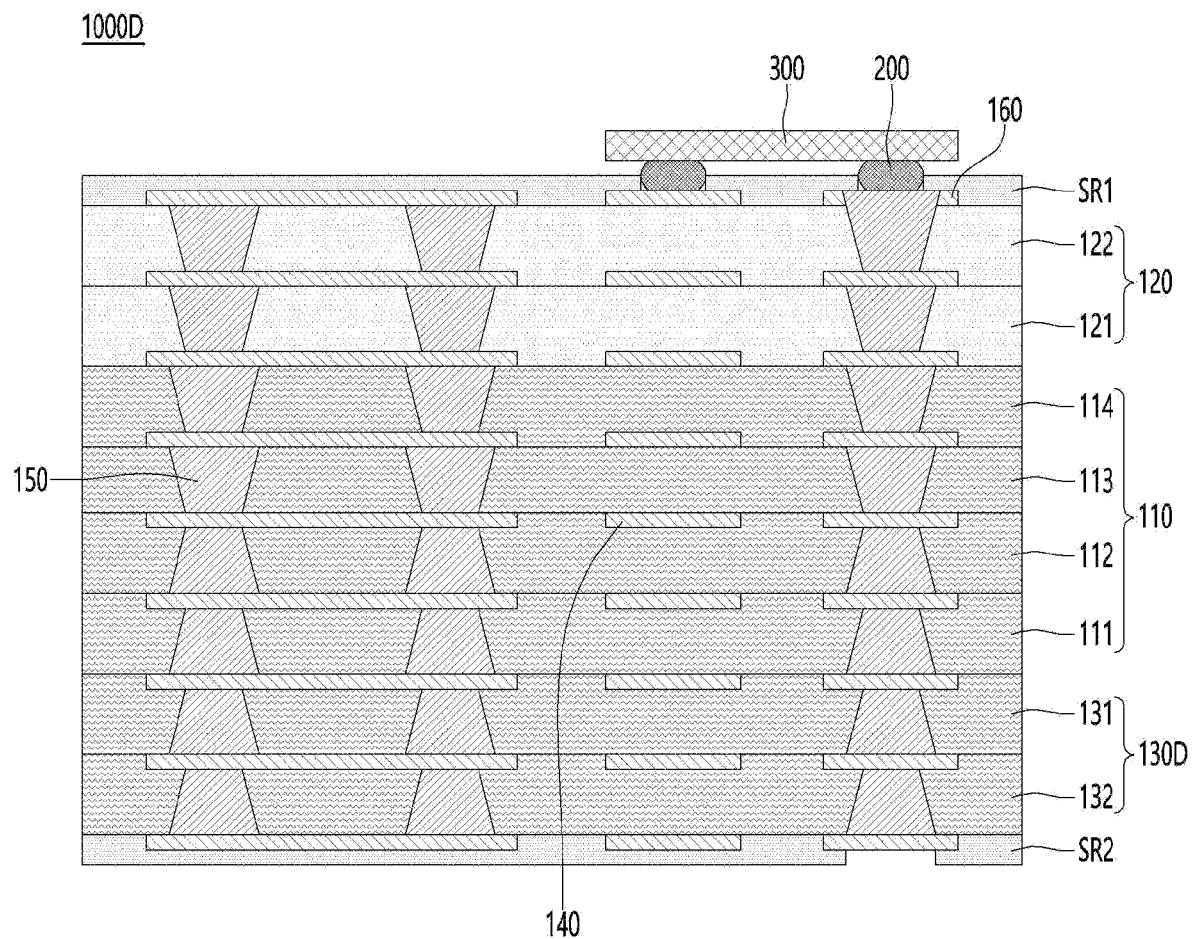
FIG. 12 is a view showing a cross-sectional view of a circuit board according to a fifth embodiment.

FIG. 12 is a view showing a cross-sectional view of a circuit board according to a fifth embodiment.

Referring to FIG. 12, the circuit board 1000D may include an insulating substrate including first to third insulating portions, a first pad 160, a first protective layer SR1, a second protective layer SR2, a solder paste 200 and an electronic component 300.

In this case, in the first to fourth embodiments, the second insulating portion and the third insulating portion formed of the RCC are respectively disposed on and under and below the first insulating portion formed of the prepreg.

Alternatively, the insulating portion formed of the RCC may be disposed only on one side of the first insulating portion formed of the prepreg.

That is, the second insulating portion 130D may be formed of a prepreg instead of the RCC compared to the first embodiment.

Accordingly, the circuit board 1000D according to the fifth embodiment includes a total of two layers of the RCC. And, when the circuit board includes two layers of the RCC, the coefficient of thermal expansion and the filler content of the RCC may be determined in the same manner as in the fourth embodiment of FIG. 11.

That is, in the embodiment, the coefficient of thermal expansion of the RCC and the filler content therefor may be determined according to the total number or thickness of the RCC in the circuit board.

On the other hand, in the embodiment, when the RCC is formed of 6 layers (clearly, the RCC occupies 50% to 80% of the thickness of the entire insulating layer, or the RCC occupies 50% to 80% of the total insulating layer thickness), the degree of warpage when the coefficient of thermal expansion of the RCC is in the range of 10 to 30 ($10^{-6}$ m/m·k) and degree of warpage in the case of having 35 ($10^{-6}$ m/m·k) out of the above range were compared Here, when the thermal expansion coefficient of the RCC of the circuit board including the six-layer RCC is 35 ($10^{-6}$ m/m·k), it was confirmed that the warpage of about 10 mm occurred.

On the other hand, when the circuit board including the six-layer RCC has a coefficient of thermal expansion of 10 to 30 ($10^{-6}$ m/m·k) of the circuit board, it can be confirmed that a warpage of about 2 mm occurs, and it was confirmed that the degree of warpage was improved by about 80% compared to the comparative example.

The circuit board according to the embodiment may include a buffer layer disposed between the insulating layer and the circuit pattern. That is, in the circuit board according to the embodiment, the buffer layer may be formed on a surface of the circuit pattern or the buffer layer may be formed on the insulating layer. The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that adhesion is reduced.

Accordingly, adhesion between the insulating layer and the circuit pattern may be improved by disposing a buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, even when the circuit board according to the embodiment is used for a high frequency purpose, it is possible to reduce the transmission loss of the high frequency signal by maintaining the surface roughness of the circuit pattern low, even if the surface roughness of the circuit pattern is kept low, it is possible to secure the adhesion between the insulating layer and the circuit pattern by the buffer layer, and thereby, the overall reliability of the circuit pattern can be ensured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and as the first material is formed in the insulating layer to be disposed inside the network structure of the second material, and thereby phase separation of the first material and the second material may be inhibited. Accordingly, the insulating layer may form the first material and the second material as a single phase, thereby improving the strength of the insulating layer.

That is, the free volume of the second material having a network structure, that is, molecular motion, is increased by cross-linking, and accordingly polymer chains having a network structure can be structured so that they are not closely arranged, and the first material and the second material may be formed as a single phase inside the insulating layer by partially disposing the first material inside the network structure.

Therefore, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

In addition, since the circuit board according to the embodiment includes an insulating layer having a low dielectric constant and a low thermal window coefficient, it can replace the existing insulating layer including glass fibers. Specifically, the circuit board according to the embodiment may remove the glass fiber included in the insulating layer. Specifically, in the circuit board according to the embodiment, the dielectric constant and the coefficient of thermal expansion of the insulating layer can be easily adjusted by using the resin and the filler of the RCC (Resin coated copper), and accordingly, the overall thickness of the printed circuit board can be reduced by configuring the insulating layer with the conventional RCC that does not include glass fibers. Furthermore, since the circuit board according to the embodiment is formed of an insulating layer having a low coefficient of thermal expansion, it is possible not only to remove the core layer for securing strength, but also to reduce the thickness of the insulating layer, and accordingly, it is possible to provide an insulating layer having a thickness smaller than that of the circuit pattern.

In addition, the circuit board according to the embodiment adjusts the content of the filler included in the RCC by using the characteristic that the coefficient of thermal expansion varies according to the content of the filler, and through this, the coefficient of thermal expansion of the RCC is adjusted. At this time, in the embodiment, the coefficient of thermal expansion of the RCC is determined to correspond to the coefficient of thermal expansion of the prepreg including the glass fiber. That is, as the difference between the coefficient of thermal expansion of the prepreg and the coefficient of thermal expansion of the RCC increases, the degree of occurrence of warpage of the circuit board increases. Therefore, in the embodiment, the coefficient of thermal expansion of the RCC is determined using the thermal expansion coefficient of the prepreg, so that the degree of warpage of the printed circuit board can be minimized.

In addition, the embodiment allows the coefficient of thermal expansion of the RCC to be selectively controlled according to the number of layers occupied by the RCC in the entire insulating layer laminated structure of the circuit board. Specifically, when the number of layers occupied by the RCC in the entire insulating layer laminated structure of the embodiment increases, the coefficient of thermal expansion is reduced by increasing the filler content in the RCC. Accordingly, it is possible to improve the degree of warpage that changes according to the number of layers occupied by the RCC in the circuit board of the embodiment, and accordingly, the reliability of the circuit board can be improved.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
an insulating portion comprising a plurality of insulating layers,
wherein the insulating portion includes:
a first insulating portion;
a second insulating portion disposed on the first insulating portion and having a coefficient of thermal expansion corresponding to the first insulating portion; and
a third insulating portion disposed under the first insulating portion and having a coefficient of thermal expansion corresponding to the first insulating portion;
wherein the first insulating portion includes a first insulating layer including glass fibers, and
wherein the second and third insulating portions include with a second insulating layer having a coefficient of thermal expansion in the range of 10 to 65 ($10^{-6}$ m/m·k) and not including glass fibers.

2. The circuit board of claim 1, wherein a sum of a number of layers of the second insulating layer of the second and third insulating portions satisfies a range of 10% to 30% of a total number of layers of the plurality of insulating layers.

3. The circuit board of claim 1, wherein each of the second and third insulating portions includes:
the second insulating layer, and
a filler contained in the second insulating layer and having 40 wt % to 55 wt %.

4. The circuit board of claim 2, wherein the sum of the number of layers of the second insulating layer of the second and third insulating portions satisfies a range of 30% to 50% of the total number of layers of the plurality of insulating layers.

5. The circuit board of claim 1, wherein the second insulating layer each of the second and third insulating portions includes
a filler having 55 wt % to 73 wt %.

6. The circuit board of claim 1, wherein the second insulating layer of the second and third insulating portions includes a first compound including polyphenyl ether (PPE); and a second compound including tricyclodecane and a terminal group connected to the tricyclodecane, and
wherein a weight ratio of the first compound to the second compound is 4:6 to 6:4.

7. The circuit board of claim 6, wherein the terminal group includes at least one of an acrylate group, an epoxide group, a carboxyl group, a hydroxyl group, and an isocyanate group, and
wherein the first compound and the second compound are not chemically bound.

8. The circuit board of claim 1, wherein the second insulating layer of the second and third insulating portions has a dielectric constant in the range of 2.03 to 2.7.

9. The circuit board of claim 1, wherein a sum of thickness of the second insulating layer of the second and third insulating portions satisfies a range of 10% to 30% of a total thickness of the plurality of insulating layers.

10. The circuit board of claim 1, wherein the second insulating layer of the second and third insulating portions includes a Resin Coated Copper (RCC).

11. The circuit board of claim 4, wherein the sum of the thickness of the second insulating layer of the second and third insulating portions satisfies a range of 30% to 50% of the total thickness of the plurality of insulating layers.

12. The circuit board of claim 11, wherein the second insulating layer includes a resin coated copper (RCC) with a coefficient of thermal expansion in the range of 10 to 50 (10−6m/m·k).

13. The circuit board of claim 1, wherein a sum of a number of layers of the second insulating layer of the second and third insulating portions satisfies a range of 50% to 80% of a total number of layers of the plurality of insulating layers.

14. The circuit board of claim 13, wherein a sum of thickness of the second insulating layer of the second and third insulating portions satisfies a range of 50% to 80% of a total thickness of the plurality of insulating layers.

15. The circuit board of claim 14, wherein the second insulating layer includes a resin coated copper (RCC) with a coefficient of thermal expansion in the range of 10 to 30 (10−6m/m·k).

16. The circuit board of claim 15, wherein the second insulating layer of each of the second and third insulating portions includes a filler having 73 wt % to 90 wt %.

17. The semiconductor package of claim 8, wherein each of the first and second insulating layers comprises a plurality of layers,
wherein a total number of layers of the plurality of second insulating layers satisfies a range of 30% to 50% of a total number of the first and second insulating layers,
wherein a total thickness of the plurality of second insulating layers satisfies a range of 30% to 50% of a total thickness of the first and second insulating layers, and
wherein each of the second insulating layer has a coefficient of thermal expansion in a range of 10 to 50 (10−6m/m·k).

18. The semiconductor package of claim 8, wherein each of the first and second insulating layers comprises a plurality of layers,
wherein a total number of layers of the plurality of second insulating layers satisfies a range of 50% to 80% of a total number of the first and second insulating layers,
wherein a total thickness of the plurality of second insulating layers satisfies a range of 50% to 80% of a total thickness of the first and second insulating layers, and
wherein each of the second insulating layer has a coefficient of thermal expansion in a range of 10 to 30 (10−6m/m·k).

19. A semiconductor package comprising: a first insulating layer including glass fibers; and a second insulating layer disposed on the first insulating layer and not including glass fibers; a pad disposed on the second insulating layer; and an electronic component disposed on the pad; wherein the second insulating layer has a coefficient of thermal expansion in a range of 10 to 65 (10−6m/m·k), and wherein the first insulating layer has a coefficient of thermal expansion corresponding to the coefficient of thermal expansion of the second insulating layer.

20. The semiconductor package of claim 19, wherein each of the first and second insulating layers comprises a plurality of layers,
wherein a total number of layers of the plurality of second insulating layers satisfies a range of 10% to 30% of a total number of the first and second insulating layers, and
wherein a total thickness of the plurality of second insulating layers satisfies a range of 10% to 30% of a total thickness of the first and second insulating layers.

* * * * *